United States Patent
Ashida et al.

(10) Patent No.: US 12,117,606 B2
(45) Date of Patent: Oct. 15, 2024

(54) MEMS PHASED-ARRAY FOR LiDAR APPLICATIONS

(71) Applicant: SILICON LIGHT MACHINES CORPORATION, Sunnyvale, CA (US)

(72) Inventors: Yuki Ashida, Kyoto (JP); Stephen Hamann, Mountain View, CA (US); Olav Solgaard, Stanford, CA (US); Alexander Payne, Ben Lommond, CA (US); Lars Eng, Los Altos, CA (US); James Hunter, Campbell, CA (US)

(73) Assignees: SCREEN HOLDINGS CO., LTD., Kyoto (JP); Silicon Light Machines Corporation, San Jose, CA (US)

( * ) Notice: Subject to any disclaimer, the term of this patent is extended or adjusted under 35 U.S.C. 154(b) by 975 days.

(21) Appl. No.: 17/001,477

(22) Filed: Aug. 24, 2020

(65) Prior Publication Data
US 2021/0072531 A1   Mar. 11, 2021

Related U.S. Application Data

(60) Provisional application No. 62/947,514, filed on Dec. 12, 2019, provisional application No. 62/891,977, filed on Aug. 27, 2019.

(51) Int. Cl.
*G02B 26/08* (2006.01)
*B81B 3/00* (2006.01)
(Continued)

(52) U.S. Cl.
CPC ........ *G02B 26/0833* (2013.01); *B81B 3/0083* (2013.01); *B81B 7/0067* (2013.01);
(Continued)

(58) Field of Classification Search
None
See application file for complete search history.

(56) References Cited

U.S. PATENT DOCUMENTS

| 5,459,610 A | 10/1995 | Bloom et al. |
| 6,144,481 A | 11/2000 | Kowarz et al. |

(Continued)

FOREIGN PATENT DOCUMENTS

| JP | 200156492 A | 2/2001 |
| JP | 200779443 A | 3/2007 |

(Continued)

OTHER PUBLICATIONS

Extended European Search Report for Application No. 20858593.5-1020 I 4022345 PCT/US2020048179.

(Continued)

*Primary Examiner* — Luke D Ratcliffe
(74) *Attorney, Agent, or Firm* — William Nuttle

(57) ABSTRACT

An optical scanner including micro-electromechanical system phased-arrays suitable for use in a LiDAR system, and methods of operating the same are described. Generally, the scanner includes an optical transmitter having first phased-arrays to receive light from a light source, form a swath of illumination in a far field scene and to modulate phases of the light to sweep or steer the swath over the scene in two-dimensions (2D). An optical receiver in the scanner includes second phased-arrays to receive light from the far field scene and direct at least some of the light onto a detector. The second phased-arrays are configured to de-scan the received light by directing light reflected from the far field scene onto the detector while rejecting background light. In one embodiment the second phased-arrays direct light from a slice of the far field scene onto a 1D detector array.

27 Claims, 21 Drawing Sheets

(51) Int. Cl.
  *B81B 7/00* (2006.01)
  *B81B 7/02* (2006.01)
  *G01S 7/481* (2006.01)
  *G02B 5/18* (2006.01)

(52) U.S. Cl.
  CPC .............. *B81B 7/02* (2013.01); *G01S 7/4817* (2013.01); *G02B 5/1814* (2013.01); *B81B 2201/047* (2013.01)

(56) References Cited

U.S. PATENT DOCUMENTS

| | | | |
|---|---|---|---|
| 10,746,983 B2 | 8/2020 | Payne et al. | |
| 2003/0095318 A1 | 5/2003 | DiCarlo et al. | |
| 2017/0234984 A1 | 8/2017 | Khial et al. | |
| 2018/0267148 A1 | 9/2018 | Buettner et al. | |
| 2018/0299664 A1* | 10/2018 | Payne | G02B 26/10 |
| 2018/0301872 A1 | 10/2018 | Burroughs et al. | |
| 2018/0306925 A1 | 10/2018 | Hosseini et al. | |
| 2019/0004151 A1* | 1/2019 | Abediasl | G02F 1/292 |
| 2021/0055625 A1* | 2/2021 | Lajevardi | G01S 7/4814 |

FOREIGN PATENT DOCUMENTS

| | | |
|---|---|---|
| JP | 2007164061 A | 6/2007 |
| JP | 2013125165 A | 6/2013 |
| JP | 2018197678 A | 12/2018 |
| WO | 2004051345 A1 | 6/2004 |
| WO | 2019046135 A1 | 3/2019 |
| WO | 2019149617 A1 | 8/2019 |

OTHER PUBLICATIONS

International Search Report for International Application PCT/US20/48179 Nov. 20, 2020.
Written Opinion of International Searching Authority Application PCT/US20/48179 Nov. 20, 2020.
International Search Report for International Application PCT PCT/US18/48032 Nov. 1, 2018.
Written Opinion of International Searching Authority Application PCT PCT/US18/48032 Nov. 1, 2018.
Japanese Office Action Patent Application No. 2022-513282 (with translation); dated Apr. 2, 2024.
Taiwan Office Action Patent Application No. 109129075 (translated); dated Apr. 18, 2024.
Korean Office Action Patent Application No. 10-2022-7010045 (with translation); dated Aug. 19, 2024.

* cited by examiner

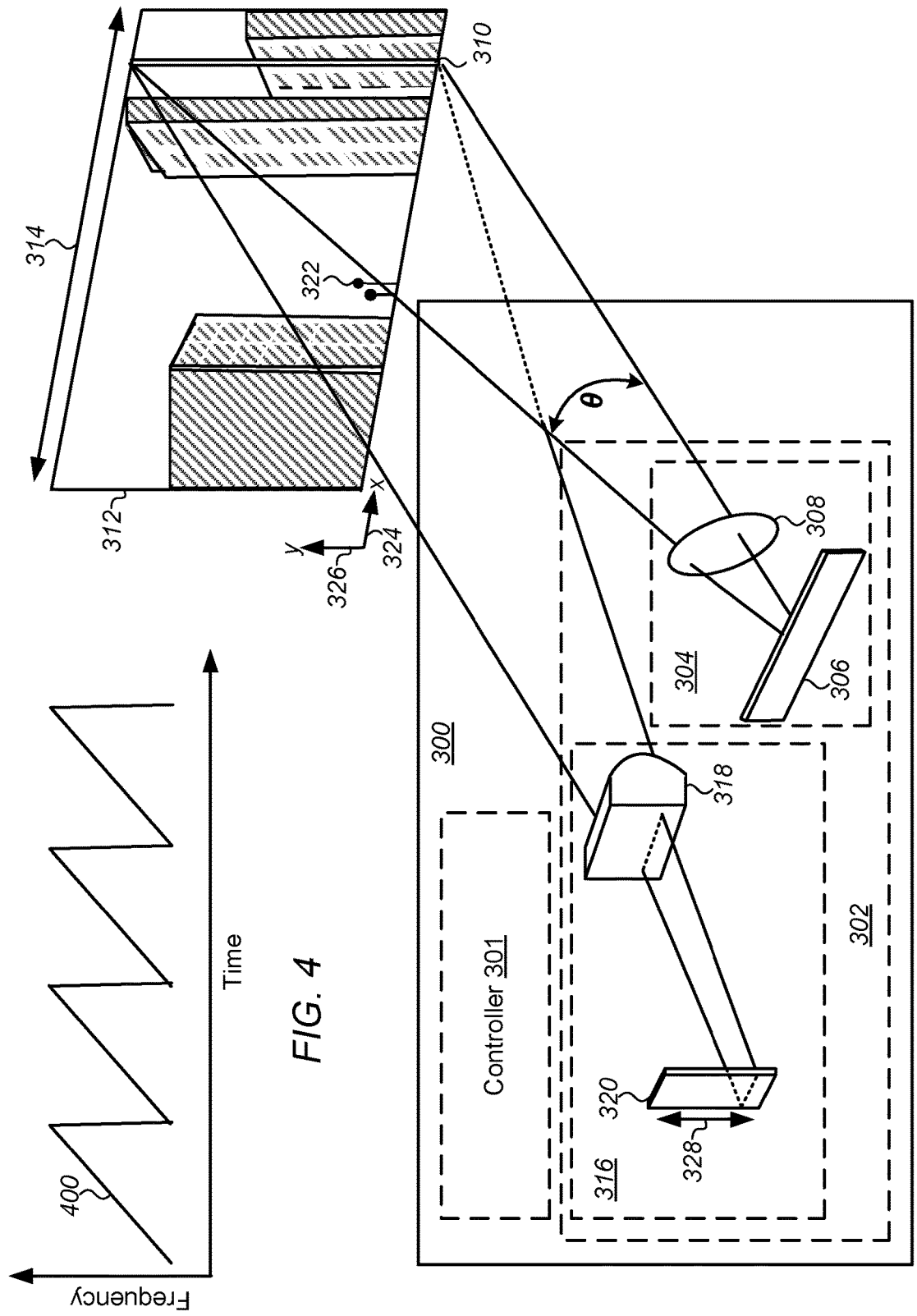

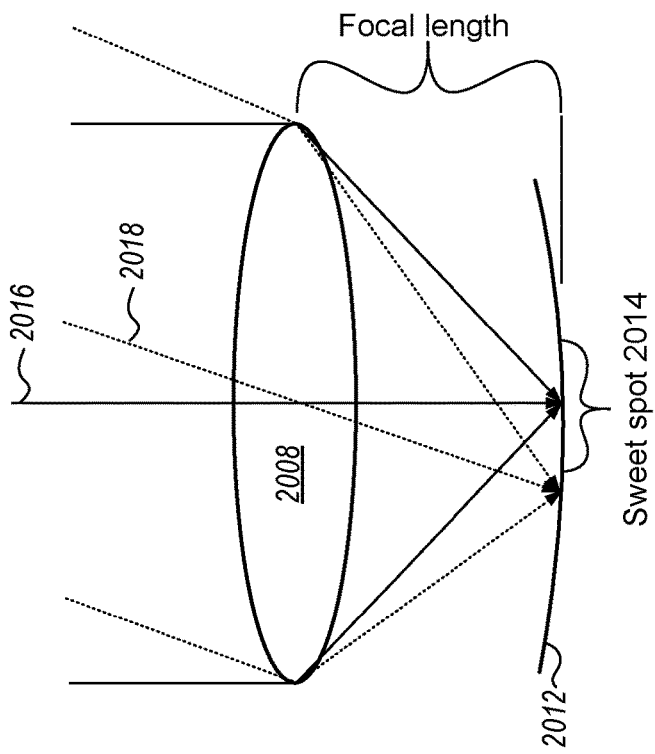
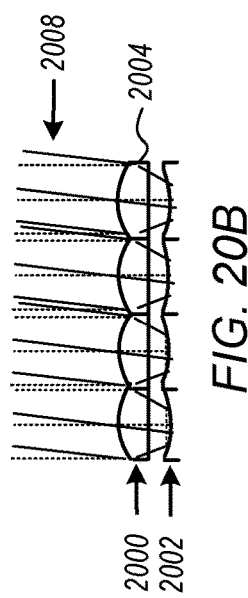
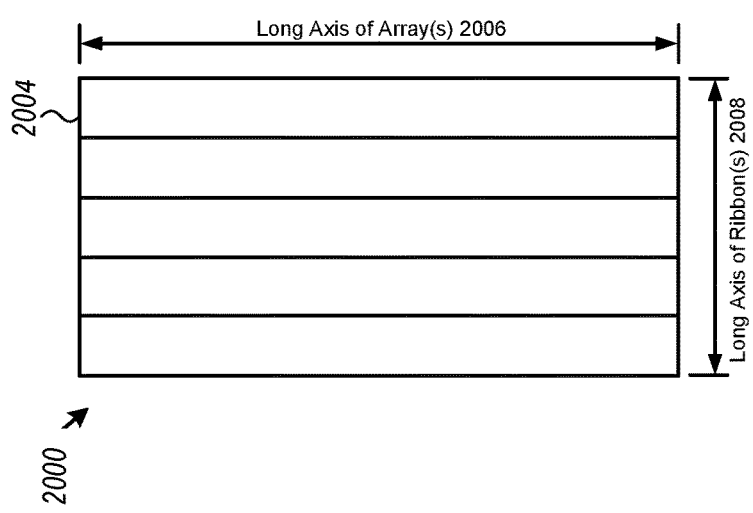
FIG. 20C
FIG. 20B
FIG. 20A

MEMS PHASED-ARRAY FOR LiDAR APPLICATIONS

CROSS-REFERENCE TO RELATED APPLICATIONS

This application claims the benefit of priority under 35 U.S.C. 119(e) to U.S. Provisional Patent Application Ser. No. 62/947,514, filed Dec. 12, 2019, and to U.S. Provisional Patent Application Ser. No. 62/891,977, filed Aug. 27, 2019, both of which are incorporated by reference herein in their entirety.

TECHNICAL FIELD

The present invention relates generally to Light Detection and Ranging (LIDAR) systems, and more particularly to LIDAR systems including Microelectromechanical System devices (MEMS) based phased-array and methods for operating the same.

BACKGROUND

Light Detection and Ranging or LIDAR systems are widely used in a number of different applications including automotive, robotics, and unmanned or autonomous vehicles for mapping, object detection and identification, and navigation. Generally, LIDAR systems work by illuminating a target in a far field scene with a light beam from a coherent light source, typically a laser, and detecting the reflected light with a sensor. Differences in light return times and wavelengths are analyzed in the LiDAR system to measure a distance to the target, and, in some applications, to render a digital 3-D representation of the target.

Traditional LiDAR systems used a mechanical scanner, such as a spinning or moving mirror, to steer the light beam over the target. However, these mechanical LIDAR systems are rather bulky and relatively expensive pieces of equipment making them unsuitable for use in many applications.

A more recent technology is solid-state LiDAR systems in which the scanner is replaced by MEMS-based spatial light modulators used to form a MEMS phased-array built entirely on a single substrate or chip. Solid-state LiDAR systems have the potential to provide cheaper, more compact systems, with higher resolution than traditional LiDAR systems. Although capable at least in theory of providing much faster beam steering than a traditional mechanical LiDAR system, achieving large scan angles, needed for larger field of view (FOV) and resolution, requires small dimensions for the MEMS mirror and elements, approaching wavelengths of the light typically used in LiDAR systems. This in turn adds to the cost and complexity of the MEMS phased-array, and makes it difficult to maintain the speed advantage of the DMD-based MEMS phased-array over the mechanical scanner of traditional LiDAR systems.

Accordingly, there is a need for a MEMS phased-array and methods for operating the same to provide fast beam steering and large scan angles for use in LiDAR applications.

SUMMARY

An optical scanner including a micro-electromechanical system (MEMS) based spatial light modular to form a MEMS phased-array (hereinafter MEMS phased-array) suitable for use in a LiDAR system, and methods of making and operating the same are provided.

In one embodiment, the optical scanner includes an optical transmitter including a number of first MEMS phased-array configured to receive light from a coherent light source and to modulate phases of at least some of the received light to scan a far field scene in two-dimensions (2D), and an optical receiver including a number of second MEMS phased-array configured to receive light from the far field scene and to direct at least some of the received light onto a detector. Generally, the second MEMS phased-array are configured to de-scan the received light by directing light from the coherent light source reflected from the far field scene onto the detector while rejecting background light.

In alternative embodiments, the optical scanner can be implemented using a single shared MEMS phased-array in which the MEMS phased-array is configured to at a first time modulate phases of the light from the coherent light source to scan the far field scene at a first time, and to de-scan the received light at a second time by directing light from the coherent light source reflected from the far field scene onto the detector and rejecting background light.

In another aspect, methods for operating an optical scanner including a number of MEMS phased-array are provided. Generally, the method begins with illuminating a first microelectromechanical system (MEMS) MEMS phased-array with light from a coherent light source. Next, the first MEMS phased-array is controlled to modulate phases of the light from the coherent light source and project modulated light from the first MEMS phased-array to a far field scene to scan the far field scene in two-dimensions (2D). Finally, light from the far field scene is received on a second MEMS phased-array and the received light de-scanned by controlling the second MEMS phased-array to direct light originating from the coherent light source reflected from the far field scene onto a detector while rejecting background light.

BRIEF DESCRIPTION OF THE DRAWINGS

Embodiments of the present invention will be understood more fully from the detailed description that follows and from the accompanying drawings and the appended claims provided below, where:

FIG. 3 is a schematic diagram of a LiDAR system including an optical scanner with a MEMS phased-array illustrating an embodiment a method by which the MEMS can be used to scan a far field scene;

FIG. 4 is a diagram illustrating a change in frequency of an outgoing pulse over time for a LiDAR system using a frequency modulated continuous wave (FMCW) technique;

FIG. 20A is a schematic block diagram illustrating a top view of a lenticular array;

FIG. 20B is a cross sectional view of the lenticular array of FIG. 20A;

FIG. 20C is an optics diagram illustrating $0^{th}$ order illumination of a single modulator in a ribbon MEMS phased-array by single element of the lenticular array of FIG. 20A.

DETAILED DESCRIPTION

An optical scanner including a micro-electromechanical system (MEMS) MEMS phased-array suitable for use in a Light Detection and Ranging (LiDAR) system, and methods of making and operating the same are provided. In the following description, numerous specific details are set forth, such as specific materials, dimensions and processes parameters etc. to provide a thorough understanding of the present invention. However, particular embodiments may be practiced without one or more of these specific details, or in combination with other known methods, materials, and apparatuses. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1:
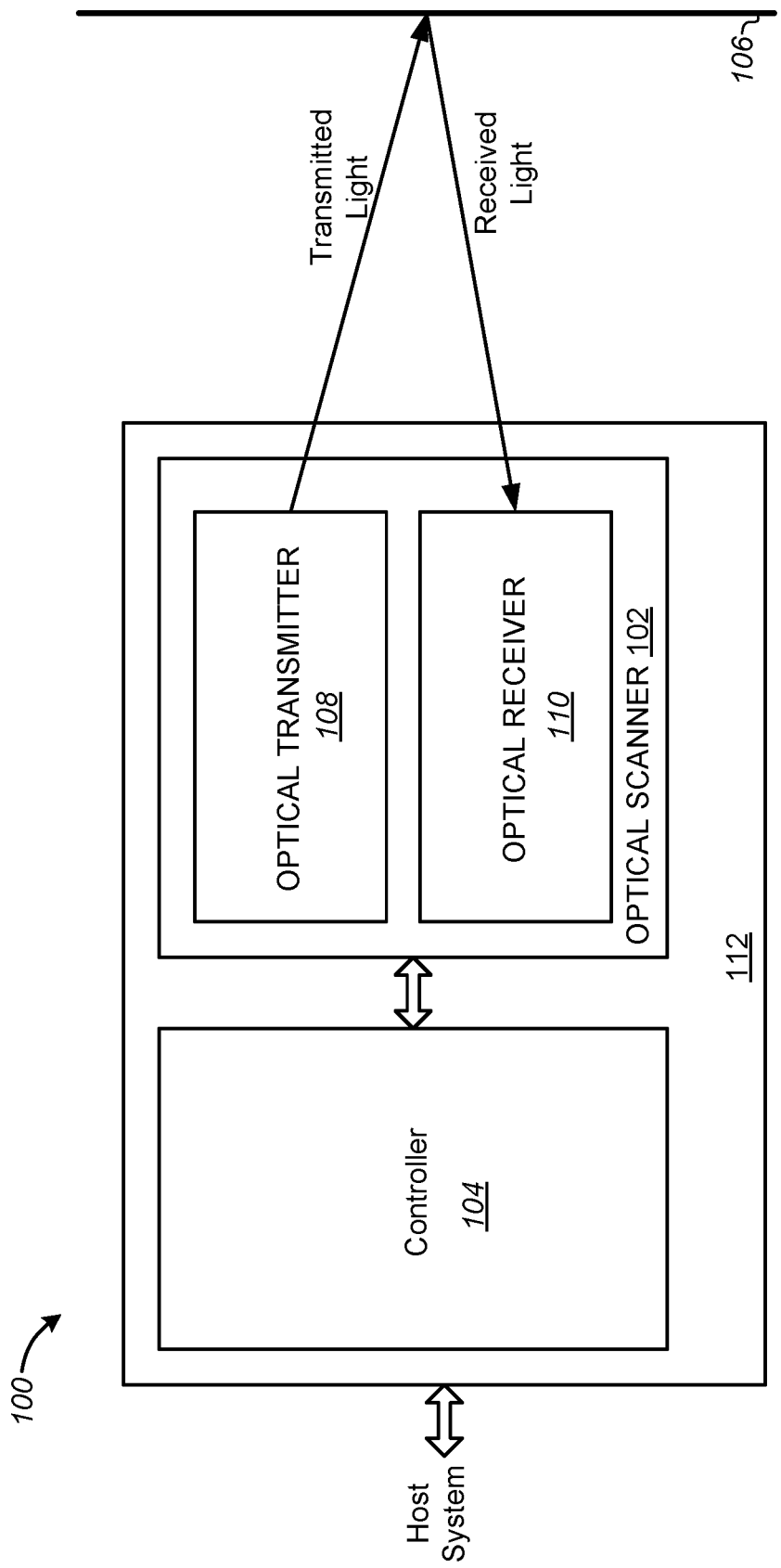
FIG. 1 is a block diagram illustrating an embodiment of a Light Detection and Ranging (LiDAR) system including a solid state optical scanner.

FIG. 1 is a block diagram illustrating an embodiment of a LiDAR system 100 including a solid state optical scanning system or optical scanner 102 according to the present disclosure. Referring to FIG. 1 the LiDAR system 100 generally includes a microcontroller or controller 104 to control operation of other components of the LiDAR system, including the optical scanner 102, and to interface with a host system (not shown). The controller 104 includes a processor and data processing circuitry to analyze signals from the optical scanner 102 to detect and measure a location of objects in a far field scene 106, estimate a time of flight (TOF) of distance between the objects and the LiDAR system 100 or host, and, by repeating the preceding measurements over time, detect and measure a velocity and direction of moving objects in the far field scene. Generally, the controller 104 further includes additional circuits and memory to measure a size of and identify discrete objects, such as cars or pedestrians, sensed in the far field scene 106. Optionally, the controller 104 can further include memory and circuits to create a three dimensional (3D) model of the far field scene 106.

The optical scanner 102 includes an optical transmitter 108 to generate, transmit and scan a light over the far field scene 106 in at least two dimensions, and an optical receiver 110 to receive reflected light from the far field scene. Generally, both the optical transmitter 108 and the optical receiver 110 are both solid state. By solid state it is meant both a light scanning element of the optical transmitter 108 and a light collecting element of the optical receiver 110 are made or fabricated on silicon, semiconductor or other type of substrate using microelectromechanical system devices (MEMs) and semiconductor or integrated circuit (IC) fabrication techniques. In particular, a beam steering or light scanning element of the optical scanner 102 is made using a number of MEMS phased-arrays in place of the mechanical scanner, such as a spinning or moving mirror used in a conventional LiDAR system. In some embodiments, such as that shown in FIG. 1, substantially an entire LiDAR system including the optical scanner 102, controller 104, along with any interfaces (not shown in this figure) to a host system are integrally formed on a single integrated circuit (IC 112). Because the optical scanner 102 does not include the moving or rotating elements of conventional LiDAR systems the resulting optical scanner and LiDAR system is more resilient to vibrations, and can be much smaller and cheaper.

Figure 2B:
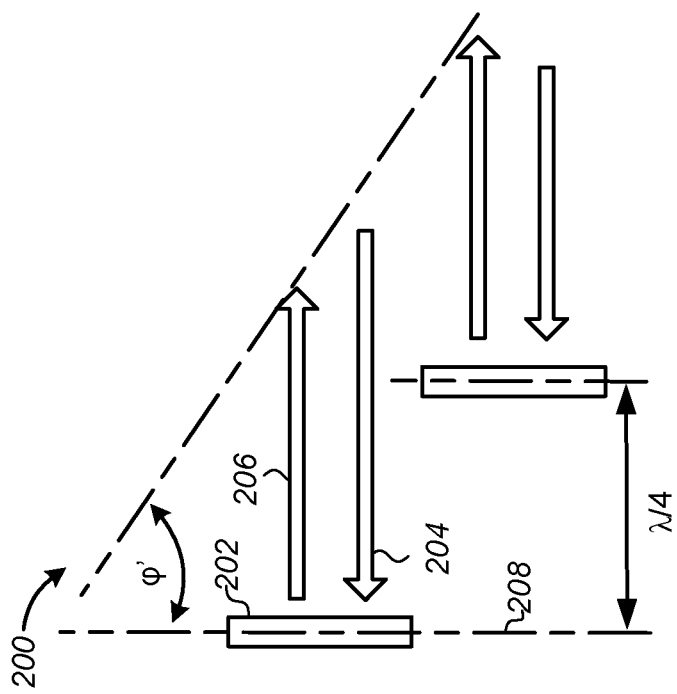
FIGS. 2A through 2C are schematic diagrams illustrating a method by which a microelectromechanical system device (MEMS) phased-array can be operated to steer a beam or swath of light.
Figure 2C:
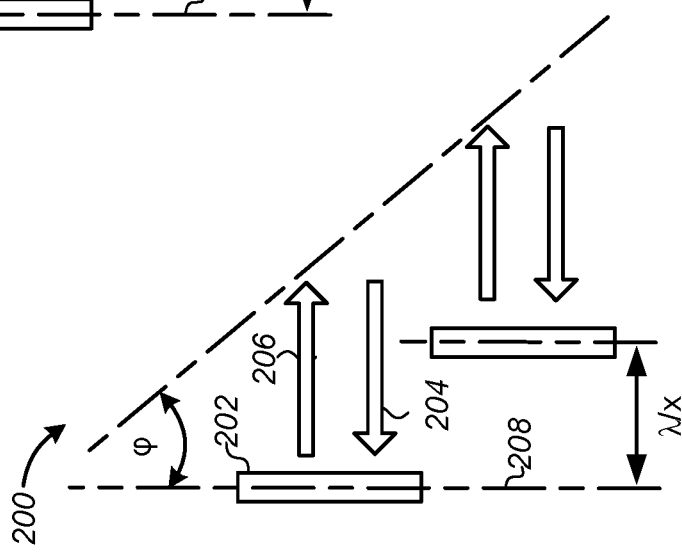
Figure 2A:
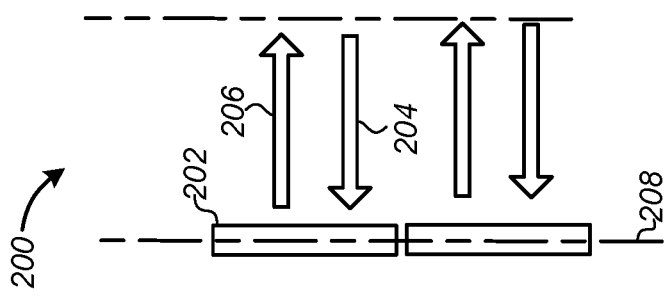

The manner or method in which an optical MEMS-based phased-array can be operated to implement beam steering or scanning will now be described with reference to FIGS. 2A through 2C. Generally, an optical MEMS-based phased-array (hereinafter MEMS phased-array) uses a row of modulators that can change the direction of a coherent light beam by adjusting the relative phase of the signal from one element to the next. FIGS. 2A through 2C show schematically two adjacent light reflective elements 202 or pixels which form a MEMS phased-array 200. Although only two pixels or light reflective elements 202 are shown, it will be understood that a MEMS phased-array used in LiDAR applications would typically include from several hundred to several thousand light reflective elements. In particular, FIGS. 2A and 2B represent the extremes of an angular scan (i.e. from 0 degrees or back reflection perpendicular to a long axis 208 of the MEMS phased-array 200, to a $\pm 1^{st}$ order). As shown in these figures a maximum phase slope possible between adjacent pixels or light reflective elements 202 is $1\pi$ or quarter wavelength ($\lambda/4$) deflection. FIG. 2C illustrates a configuration in which the deflection between adjacent pixels or light reflective elements 202 is $\lambda/x$, where x is a whole number larger than four (4), to steer the light to intermediate angles between 2A and 2B.

Referring to FIG. 2A the MEMS phased-array 200 is illuminated with a line of coherent incident light 204, and individually addressing or deflecting the light reflective elements 202 from quiescent or non-deflected state by different amounts a relative to a wavelength ($\lambda$) of incident light 204 a wave front 206 reflected from the MEMS phased-array 200 can be made to propagate away from the MEMS phased-array at angle ($\varphi$) relative to a long axis 208 of the MEMS phased-array. FIG. 2A illustrates the light reflective elements 202 in the quiescent or non-deflected state in which the reflected light propagated or steered in a direction parallel to the axis 208 of the MEMS phased-array. FIG. 2C illustrates the light reflective elements 202 in state in which the light reflective elements 202 have been deflected by an amount equal to 0.25 times the wavelength ($\lambda$) of incident light 204 and causing the reflected light to be steered or propagated away at a first angle ($\varphi'$) relative to the axis 208 of the MEMS phased-array. FIG. 2B illustrates the light reflective elements 202 in state in which the light reflective elements 202 have been deflected by an amount equal to x<0.25 times the wavelength ($\lambda$) of incident light 204 and causing the reflected light to be steered or propagated away at a second angle ($\varphi$) relative to the axis 208 of the MEMS phased-array.

It is noted that 0.25 times the wavelength ($\lambda$) of incident light 204 is the maximum by which adjacent light reflective elements 202 can be deflected without introducing phase ambiguity and results in a binary pattern creating a positive and negative first order beam. Thus, twice $\varphi$ represents a maximum angular field of view (FOV) over which a line or swath of modulated light can steered or scanned is determined by angle between $1^{st}$ order reflected light. The actual values for these angles for $1^{st}$ order reflected light is dependent on a width or pitch between the light reflective elements 202 and the wavelength ($\lambda$) of the incident light 204 but is generally given by the equation:

$$FOV = 2\sin^{-1}\frac{\lambda}{d} \quad \text{(Eq. 1)}$$

where $\lambda$ is the wavelength of the incident light and d is two widths of the light reflective elements 202.

A method of operating a LiDAR system including a MEMS phased-array to scan a far field scene will now be described with reference to FIG. 3. FIG. 3 is a schematic functional diagram of a portion of a LiDAR system 300 including controller 301 and a solid state optical scanner 302 having an optical transmitter 304 with at least one MEMS phased-array 306 configured to receive light from a light source through shaping or illumination optics (not shown in this figure), and to modulate phases of at least some of the received light and transmit or project a beam of phase modulated light through projection optics 308 to steer a line or swath 310 of illumination to scan a far field scene 312. The MEMS phased-array 306 steers the beam of light to scan the far field scene 312 by changing phase modulation of light incident on different portions of the MEMS phased-array. Generally, the first MEMS phased-array 306 is configured to scan the far field scene 312 in at least two-dimensions (2D), including an angular dimension ($\theta$), and an axial dimension (indicated by arrow 314) parallel to a long axis of the MEMS phased-array.

It is noted that although the optical scanner 304 is shown schematically as including a single MEMS phased-array 306 this need not and generally is not the case in every embodiment. Rather, as explained in detail below, it is often advantageous that the optical scanner 304 include multiple adjacent MEMS phased-arrays 306 operated in unison or a single MEMS phased-array having multiple adjacent arrays to increase either aperture width or length to increase a power or radiant flux of the transmitted or received light and to increase the point spread resolution of the system.

The optical scanner 304 further includes an optical receiver 316 including collection or receiving optics 318 to capture light from the far field scene 312, which is then directed onto a detector 320.

Referring to FIG. 3, depth or distance information from the LiDAR system 300 to a target or object 322 in the far field scene 312 can be obtained using any one of a number of standard LiDAR techniques, including pulsed, amplitude-modulated-continuous-wave (AMCW) or frequency-modulated-continuous-wave (FMCW). In pulsed and AMCW LiDAR systems the amplitude of intensity of the light transmitted is either pulsed or modulated with a signal, and the TOF from the LiDAR system 300 to the object 322 is obtained by measuring the amount by which the return signal is time-delayed. The distance to the reflected object is found by multiplying half this time by the speed of light.

FIG. 4 is a diagram illustrating a change in frequency of an outgoing pulse of transmitted light over time for a LiDAR system using an FMCW technique. Referring to FIGS. 3 and 4, in a FMCW LiDAR the frequency of an outgoing chirp or pulse 400 of transmitted light is continuously varied over time as the swath 310 of light is continuously scanned across the far field scene 312. The time to the object 322 can be determined by comparing the frequency of light reflected from the object to that of a local oscillator, and the distance to the object is found by using the speed of light as previously described. FMCW LiDAR systems have an advantage over amplitude modulated in that the local oscillator provides an inherent amplification of the detected signal.

With information on TOF the controller 301 in the LiDAR system can then calculate a location of the object 322 in the far field scene 312 along an X-axis 324 from the steering direction of the MEMS phased-array 306 when the light was transmitted from the MEMS phased-array, and along a Y-axis 326 from a sensed location of the object along an axis of the detector 320 (indicated by arrow 328) parallel to a long axis of the detector.

Embodiments of optical scanners according to the present disclosure, and which are particularly suitable for use in LiDAR systems to scan and/or identify objects or targets, such as people, buildings and automobiles, in a far field scene will now be described with reference to the block diagrams of FIGS. 5A to 5C, and to FIG. 6.

Figure 5A:
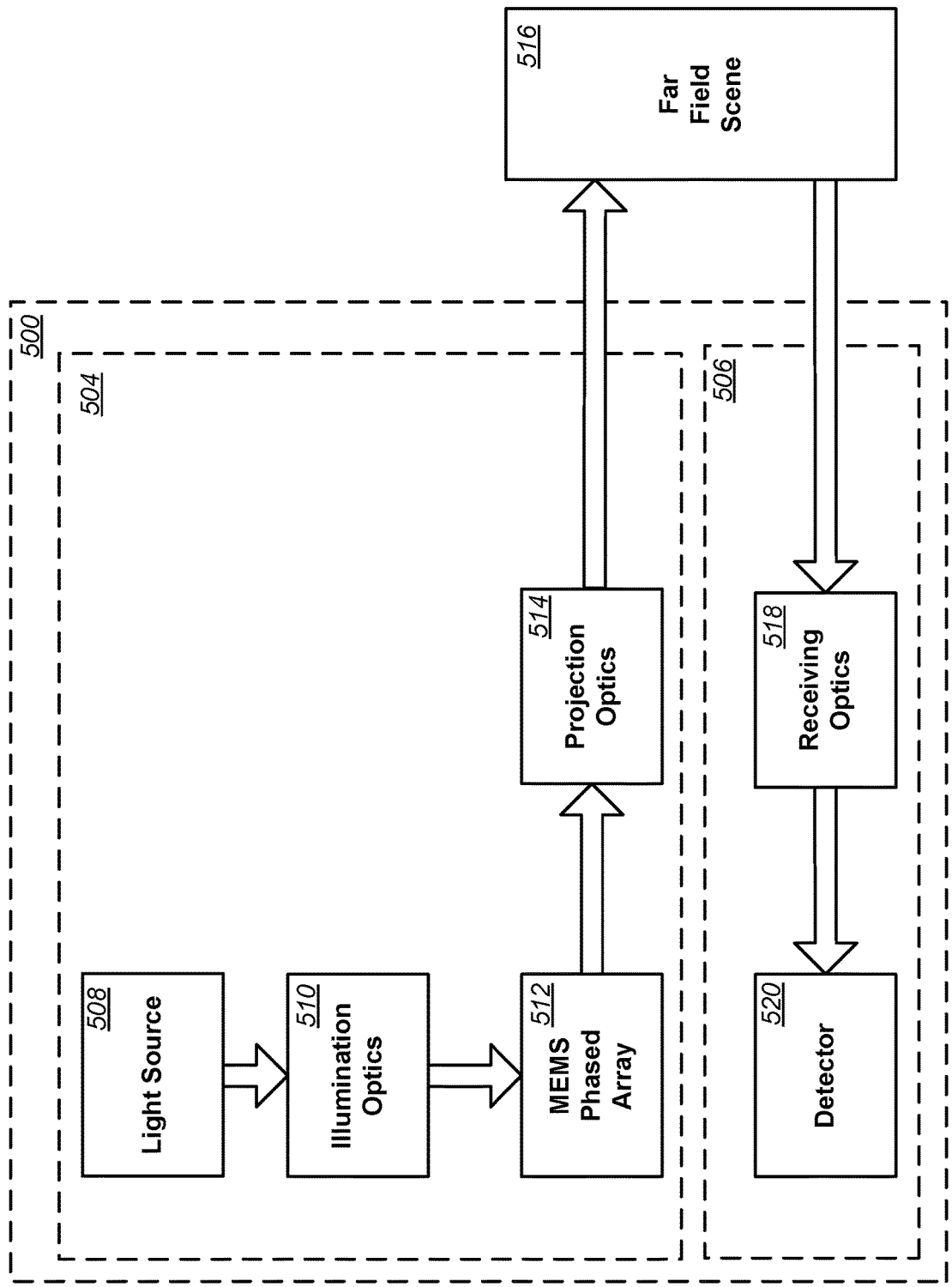
FIG. 5A is a block diagram illustrating an embodiment of a solid state optical scanner including a MEMS phased-array in an optical transmitter of the scanner.

Referring to FIG. 5A, in a first embodiment the optical scanner 500 includes an optical transmitter 504 and an optical receiver 506. The optical transmitter 504 generally includes a light source 508, shaping or illumination optics 510 to illuminate a MEMS phased-array 512 with light from the light source, and imaging or projection optics 514 to transmit or project phase modulated light from the MEMS phased-array into a far field scene 516 to scan the far field scene in at least two dimensions.

The light source 508 can include any type and number of light emitting devices capable of continuously emitting or pulsing a coherent light at a sufficient power level or power density, and at a single wavelength or frequency, or within a narrow range of wavelengths or frequencies, to enable light from the MEMS phased-array 512 to be modulated in phase and/or amplitude. Generally, the light source 508 is a continuous-wave light source that continuously emits a light that is modulated either in amplitude, for an AMCW LiDAR, or in frequency, for a FMCW LiDAR. Because objects in the far field scene are continuously illuminated; the light source can operate with less power compared to a high peak-power of pulsed systems. The light source 508 can include a number of lasers or laser emitters, such as diode lasers, vertical-cavity surface-emitting lasers (VCSELS). In one embodiment the light source the light source 508 includes a VCSEL array having a number of laser emitters to increase optical power while meeting or extending an eye-safe power limit. In another embodiment, the light source 508 includes a number of high-power lasers producing from about 5000 to about 40,000 milliwatts (mW) of power at a wavelength ($\lambda$) of from about 750 to about <2000 nm.

The illumination optics 510 can comprise a number of elements including lens integrators, mirrors and prisms, configured to transfer light from the light source 508 to the first MEMS phased-array 512 to illuminate a line of a specified width and covering substantially a full width and/or length of the MEMS phased-array. In one embodiment, the illumination optics 510 include a microlens or lenticular array (described in greater detail below) to individually illuminate one or more modulators in the first MEMS phased-array 512.

The projection optics 514 can also include lenses, integrators, mirrors and prisms, and are configured to transfer light from the MEMS phased-array 512 to illuminate a line or swath in the far field scene 516. Generally, the projection optics 514 includes magnifying optics or elements, such as Fourier Transform (FT) lenses and mirrors, to increase a field of view (FOV) of the optical scanner 500. In one embodiment, the projection optics 514 include a lenticular array to disperse the light in a first direction to form the swath of illumination perpendicular to a direction over which the projected light is moved or steered in the far field scene 516.

The optical receiver 506 generally includes receiving optics 518 to collect or receive light from the far field scene and direct or pass the received light onto a detector 520 or detector array. Like the illumination and projection optics the receiving optics 518 can include lenses, integrators, mirrors and prisms, and are configured to receive and transfer light from the far field scene 516 to the onto the detector 520. In one embodiment, the receiving optics 518 includes a lenticular array to increase an effective fill factor of the detector 520.

Generally, the detector 520 can comprise any type of detector sensitive to light in the wavelengths generated by the light source 508, including a rolling shutter camera or cameras, a one or two dimensional array of photodiode detectors, or a single photon avalanche diode (SPAD) array. In the embodiment shown in FIG. 5A, the receiving optics will be 2D, and the detector is a 2D array of detectors or a 2D detector array. LiDAR systems used in automobiles detector 520 can use lower density, higher sensitivity devices, such as APDs, for long range detection.

Figure 5B:
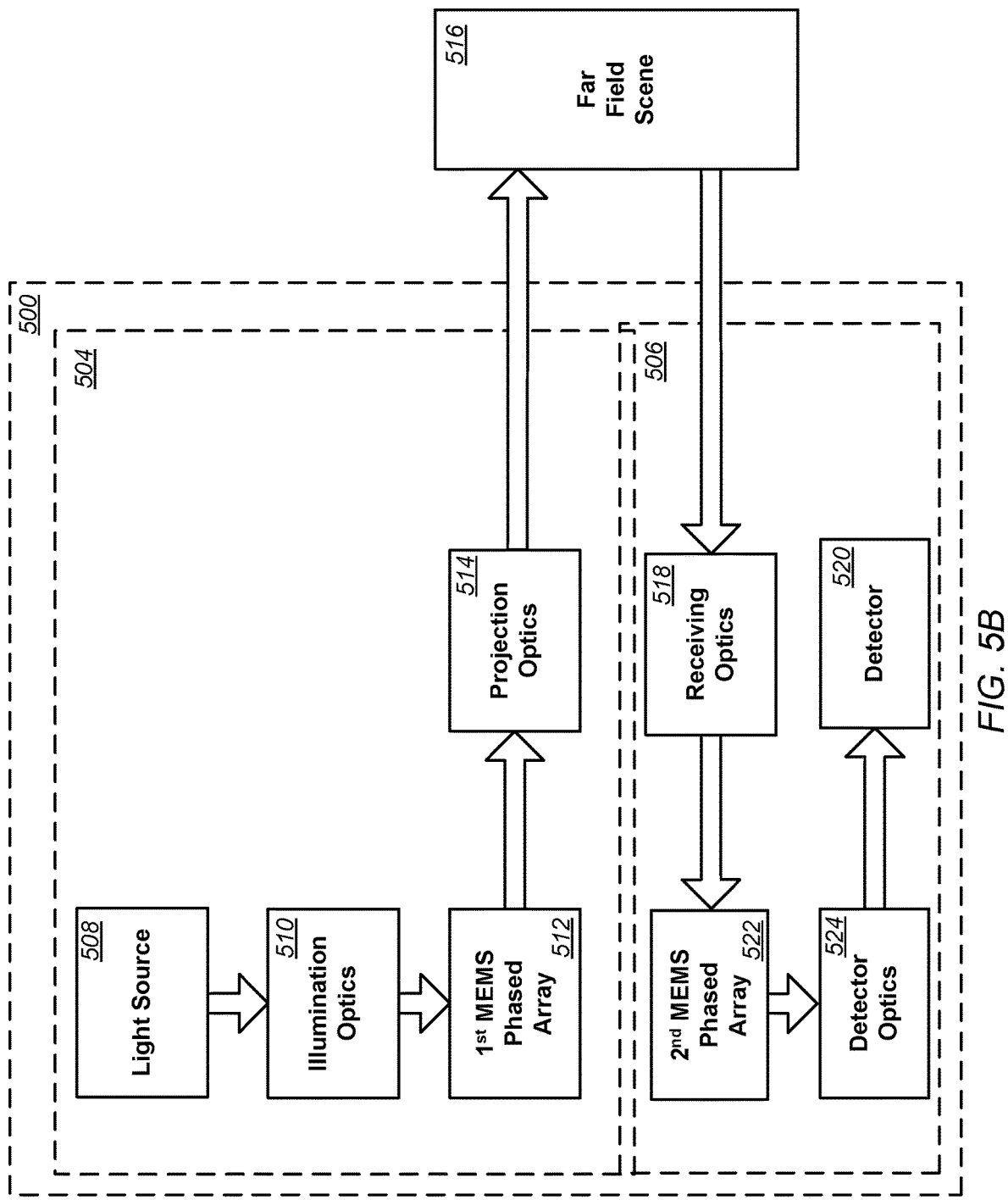
FIG. 5B is a block diagram illustrating another embodiment of the solid state optical scanner of FIG. 5A including a $1^{st}$ MEMS phased-array in an optical transmitter and a $2^{nd}$ MEMS phased-array in an optical receiver of the scanner.

In another embodiment, shown in FIG. 5B, the optical receiver 506 is a pointing optical receiver including a $2^{nd}$ MEMS phased-array 522 to de-scan collected or received light by selectively directing light reflected from a slice of the far field scene 516 onto the detector 520 while substantially rejecting background light. For example, the $2^{nd}$ MEMS phased-array directs the light from the light source reflected from the far field scene 516 onto the detector 520 by adapting the direction to which it steers light based on information on the direction to which the $1^{st}$ MEMS phased-array 512 steers the light beam. Optionally, as in the embodiment shown the optical receiver 506 can further include detector optics 524 to transfer light from the $2^{nd}$ MEMS phased-array 522 on to the detector 520. As with the illumination optics 510, projection optics 514 and receiving optics 518, the detector optics 524 can include lenses, integrators, mirrors and prisms, and configured to substantially fill or over fill the detector 520. In one embodiment, the receiving optics 518 includes a lenticular array to increase an effective fill factor of a stacked phased-array 522.

In some embodiments in which the wherein the detector 520 includes a one dimensional (1D) detector array, and the optical receiver 506 is a pointing-receiver in which the $2^{nd}$ MEMS phased-array 522 selectively directs light reflected from a slice of far field scene 516 onto the 1D detector array while rejecting light reflected from the far field scene outside of the slice and background light.

As with the embodiment shown in FIG. 5A the optical scanner 500 includes an optical transmitter 504 and an optical receiver 506. The optical transmitter 504 additionally includes the light source 508 and illumination optics 510 to illuminate the 1st MEMS phased-array 512 with light from the light source and projection optics 514 to transmit or project phase modulated light from the MEMS phased-array into the far field scene 516. The optical receiver 506 includes in addition to the $2^{nd}$ MEMS phased-array 522 the detector 520 and receiving optics 518 to collect or receive light from the far field scene 516 and to direct or pass the light to the $2^{nd}$ MEMS phased-array 522 and onto the detector 520. As the $2^{nd}$ MEMS phased-array 522 directs the light from the light source reflected from the far field scene onto the detector 520, it is possible to reduce the size or width of the detector 520, compared to the case in which the $2^{nd}$ MEMS phased-array 522 is not provided. That is, because $2^{nd}$ MEMS phased-array 522 is capable of imaging a slice of the 2D scene 516 onto the detector 520, the detector can include a 1D array detector. The full scene is reconstructed by scanning the 2$^{nd}$ MEMS phased-array.

Figure 5C:
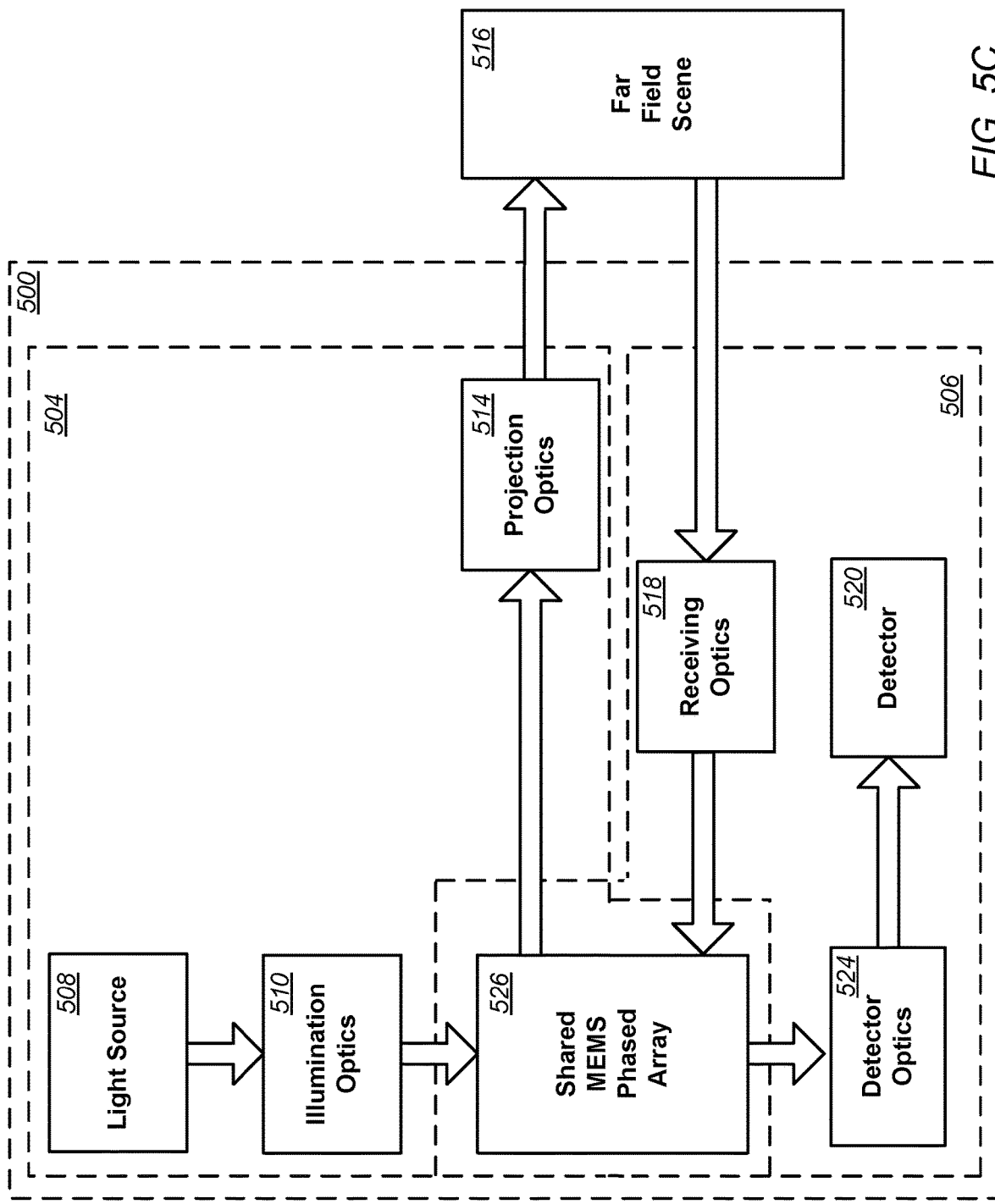
FIG. 5C is a block diagram illustrating yet another embodiment of the solid state optical scanner of FIG. 5A including a shared MEMS phased-array in both the transmitting and receiving light paths.

In yet another embodiment, shown in FIG. 5C, the optical scanner 500 includes a shared MEMS phased-array 526 configured to modulate phases of the light from a light source 508 at a first time to scan a far field scene 516, and at a second time to de-scan collected or received light by directing light from the light source reflected from the far field scene onto a detector 520 while substantially rejecting background light. As with the embodiments shown in FIGS. 5A and 5B, the optical scanner 500 includes an optical transmitter 504 and an optical receiver 506. The optical transmitter 504 includes in addition to the light source 508 and shared MEMS phased-array 526, illumination optics 510 to illuminate the MEMS phased-array with light from the light source and projection optics 514 to transmit or project phase modulated light from the MEMS phased-array into the far field scene 516. The optical receiver 506 includes in addition to the detector 520 and shared MEMS phased-array 526, receiving optics 518 to collect or receive light from the far field scene 516 and, optionally, detector optics 524 to direct or pass the light to the shared MEMS phased-array and onto the detector 520.

Figure 6:
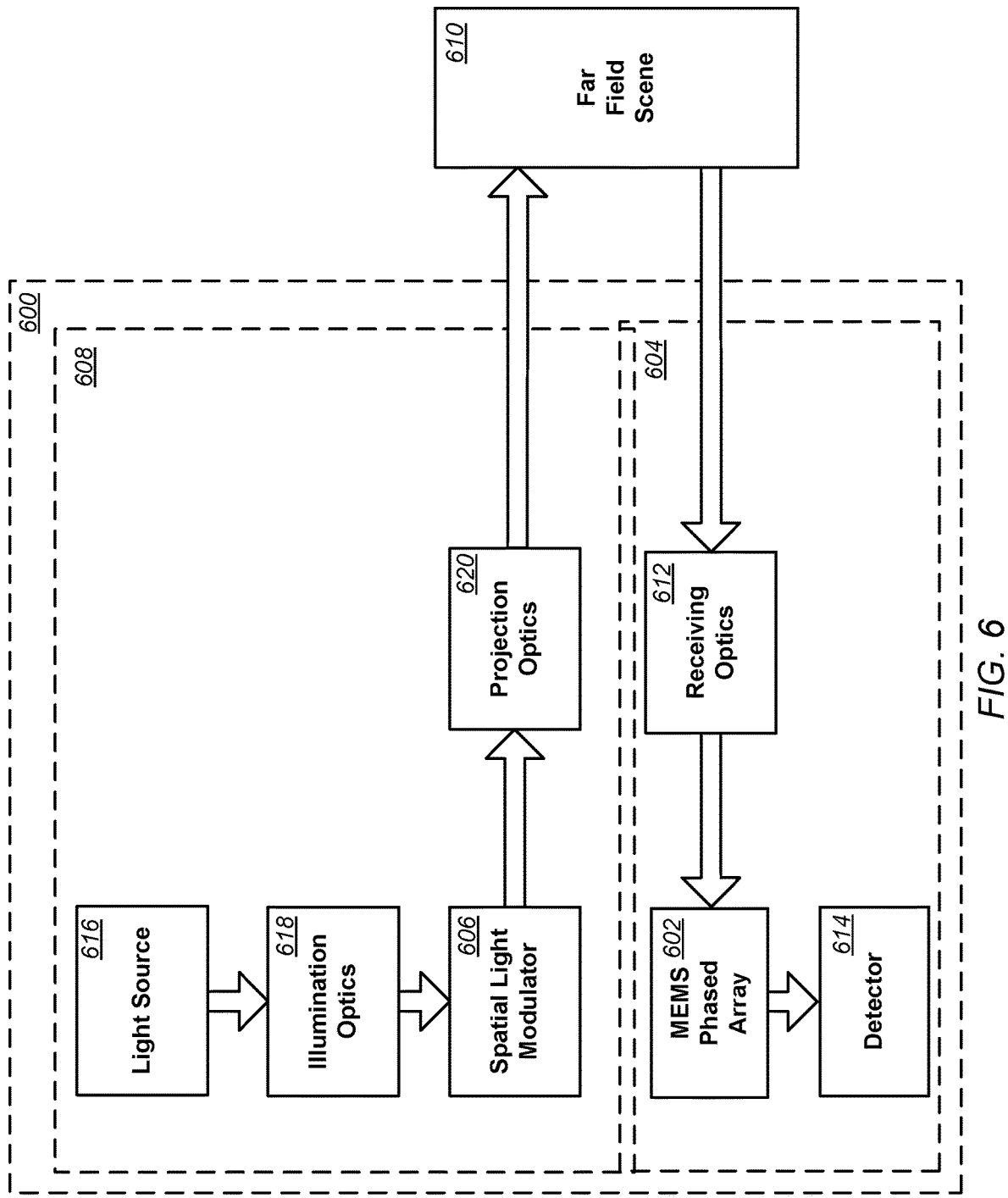
FIG. 6 is a block diagram illustrating an embodiment of an optical scanner, including a MEMS phased-array in an optical receiver of the scanner.

In another embodiment shown in FIG. 6 the optical scanner 600 can include a MEMS phased-array 602 in an optical receiver 604 of the scanner, and a spatial light modulator (SLM 606) in an optical transmitter 608. The SLM 606 in the optical transmitter 608 need not include a solid state device, but can alternatively include a mechanical scanner, such as a spinning or moving mirror, to steer the light beam over a far field scene 610. As with embodiments described above, the optical receiver 604 includes in addition to the MEMS phased-array 602 receiving optics 612 to collect or receive light from the far field scene 610 and to direct or pass the light to the MEMS phased-array and from there onto a detector 614. The optical transmitter 608 additionally includes a light source 616 and illumination optics 618 to illuminate the SLM 606 with light from the light source and projection optics 620 to transmit or project phase modulated light from the MEMS phased-array into the far field scene 610.

Embodiments of a MEMS-based spatial light modulator (SLM) to form a MEMS phased-array suitable for use in an optical scanner will now be described.

One type of MEMS-based SLM suitable for use in a MEMS phased-array of a LIDAR system to modulate or steer a beam of light is a ribbon-type SLM or ribbon MEMS phased-array including multiple electrostatically deflectable ribbons, such as a Grating Light Valve (GLV™), commercially available from Silicon Light Machines, in Sunnyvale CA Ribbon-type SLMs generally include a one dimensional (1D) linear array composed of thousands of free-standing, addressable electrostatically actuated movable structures, such as elongated elements or ribbons, each having a light reflective surface supported over a surface of a substrate. Each of the ribbons includes an electrode and is deflectable through a gap or cavity toward the substrate by electrostatic forces generated when a voltage is applied between the electrode in the ribbon and a base electrode formed in or on the substrate. The ribbon electrodes are driven by a drive channel in a driver, which may be integrally formed on the same substrate with the array. Ribbon-type SLMs are suited for a wide range of LiDAR applications because they are small, fast, low cost systems, which are simple to fabricate, integrate and package while still capable of providing large diffraction angles. Additionally, ribbon-type SLMs are capable of working to produce 3D scans or models when used in combination with rolling shutter cameras, photodiode detector array and SPAD array, and a wide range of illumination sources, including a laser array or bar with multiple semiconductor diode lasers or VCSELs.

An embodiment of a ribbon-type SLM will now be described with reference to FIGS. 7A and 7B. For purposes of clarity, many of the details of MEMS in general and MEMS-based SLMs in particular that are widely known and are not relevant to the present invention have been omitted from the following description. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

Figure 7A:
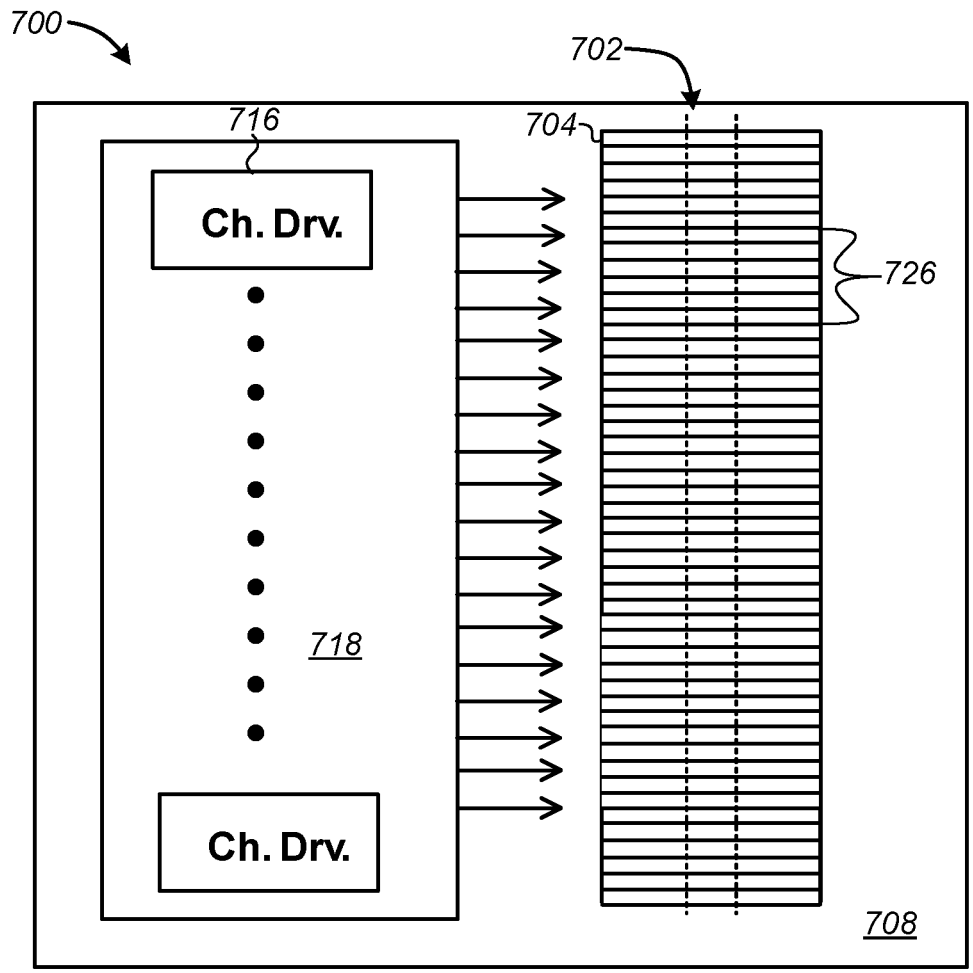
FIGS. 7A and 7B are diagrams illustrating an embodiment of a MEMS-based ribbon-type spatial light modulator (SLM) used to form a MEMS phased-array suitable for use in an optical scanner.
Figure 7B:
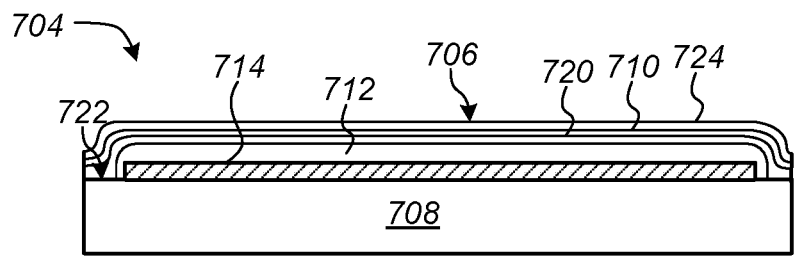

Referring to FIGS. 7A and 7B in the embodiment shown the SLM is a one dimensional (1D) ribbon-type SLM 700 that includes a linear array 702 composed of thousands of free-standing, addressable electrostatically actuated ribbons 704, each having a light reflective surface 706 supported over a surface of a substrate 708. Each of the ribbons 704 includes an electrode 710 and is deflectable through a gap or cavity 712 toward the substrate 708 by electrostatic forces generated when a voltage is applied between the electrode in the ribbon and a base electrode 714 formed in or on the substrate. The ribbon electrodes 710 are driven by a drive channel 716 in a driver 718, which may be integrally formed on the same substrate 708 with the linear array 702.

A schematic sectional side view of an elongated element or ribbon 704 of the SLM 700 of FIG. 7A is shown in FIG. 7B. Referring to FIG. 7B, the ribbon 704 includes an elastic mechanical layer 720 to support the ribbon above a surface 722 of the substrate 708, a conducting layer or electrode 710 and a reflective layer 724 including the reflective surface 706 overlying the mechanical layer and conducting layer.

Generally, the mechanical layer 720 comprises a taut silicon-nitride film (SiNx), and is flexibly supported above the surface 722 of the substrate 708 by a number of posts or structures, typically also made of SiNx, at both ends of the ribbon 704. The conducting layer or electrode 710 can be formed over and in direct physical contact with the mechanical layer 720, as shown, or underneath the mechanical layer. The conducting layer or ribbon electrode 710 can include any suitable conducting or semiconducting material compatible with standard MEMS fabrication technologies. For example, the electrode 710 can include a doped polycrystalline silicon (poly) layer, or a metal layer. Alternatively, if the reflective layer 724 is metallic it may also serve as the electrode 710.

The separate, discrete reflecting layer 724, where included, can include any suitable metallic, dielectric or semiconducting material compatible with standard MEMS fabrication technologies, and capable of being patterned using standard lithographic techniques to form the reflective surface 706.

In the embodiment shown, a number of ribbons are grouped together to form a large number of MEMS pixels 726, with or more ribbons in the array driven by a single driver channel 716.

Figure 8:
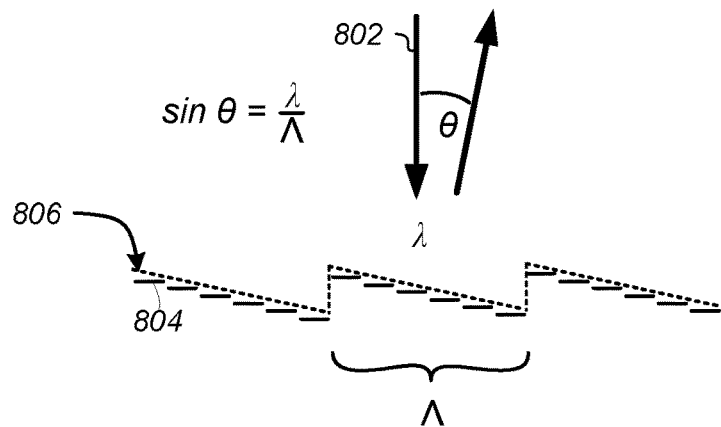
FIG. 8 is a schematic representation of pitch and amplitude of a number of individual ribbons of the SLM of FIGS. 7A and 7B beam steering.

FIG. 8 is a schematic representation of how the pitch and amplitude of an ensemble of SLM ribbons in FIGS. 7A and 7B can be adjusted to steer a beam of light. Referring to FIG. 8, in order to steer a normally incident beam 802 through a reflected steering angle θ, ribbons 804 are arranged in a "blaze" pattern 806 of pitch or period Λ. As the blaze pitch A is reduced, light is steered over larger angles θ. Note that the blaze period Λ can assume integer or non-integer values to allow continuous modulation of the steering angle θ. The largest steering angle is achieved when the blaze period comprises two ribbons.

Figure 9:
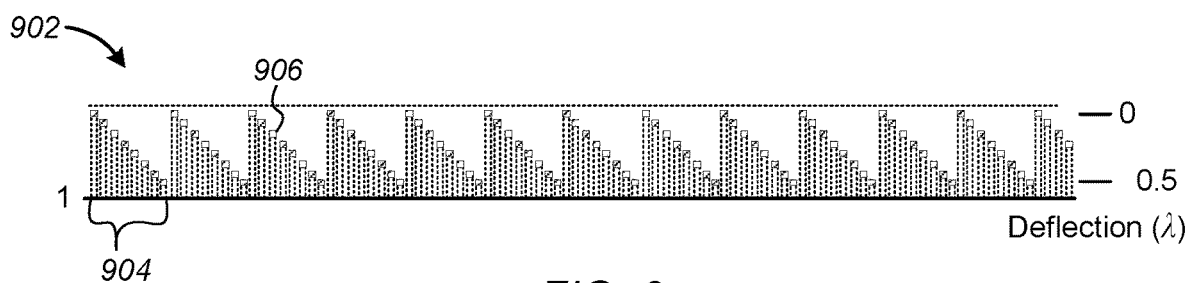
FIG. 9 is a schematic representation of pitch and amplitude of portion of a linear array of modulators of the SLM of FIGS. 7A and 7B arranged in a blaze pattern.

FIG. 9 is a schematic representation of a portion of a linear array 902 in a ribbon-type SLM shown in cross-section to long axes of the ribbons. The deflection of ribbons 906 is varied to impart a monotonic phase variation along the array. Note that once the phase variation exceeds one wave (i.e. half wave deflection), the deflection pattern is continued via modulo division by the wavelength forming the blaze groupings 903. An SLM with programmable MEMS elements (ribbons 906) allow light to be continuously scanned in angle, making it particularly useful in steering applications, such as LIDAR.

Figure 10:
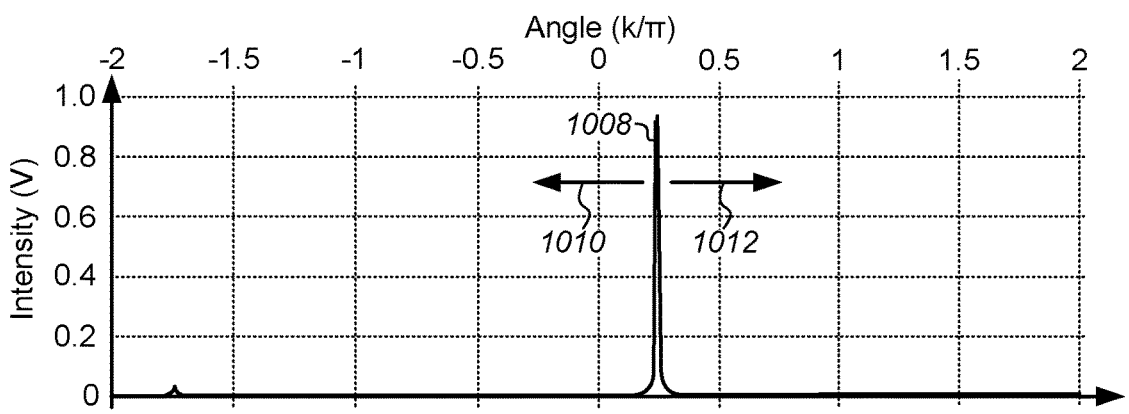
FIG. 10 is a graph of intensity versus steering angle for the array represented in FIG. 9, illustrating the suitability of the MEMS phased-array for applications requiring fast beam steering and large scan angles.

FIG. 10 is a graph of intensity versus steering angle and illustrates the suitability of the ribbon-type SLM represented schematically in FIG. 9 for phased-array applications. Referring to FIG. 10, it is seen that the periodic spatial pattern along ribbon-type SLM shown in FIG. 9 creates a phased-array reflection, while varying the spatial period and amplitude of the pattern changes the reflected beam angle, allowing the ribbon-type SLM to rapidly cycle through patterns to sweep beam across field. In particular, it is noted that as the period of the spatial pattern on the array 902 increases, i.e., as each period includes a greater number of ribbons, a maximum intensity 1008 with which light is reflected from the array 902 shifts to the left as indicated by arrow 1010. As spatial period decreases or the number of ribbons in each period reduced, the maximum intensity 1008 with which light is reflected from the array 902 shifts to the right as indicated by arrow 1012.

The high switching speed of the ribbon-type SLM makes it attractive for MEMS phased-array applications such as LiDAR. However, designing a ribbon-type SLM for LiDAR presents two challenges. First, a large stroke, i.e., an amount by which an individual ribbon can be deflected, is generally used. Often it is suggested that the ribbon-type SLM have a stroke up to or exceeding one-half the wavelength of the light being modulated or steered. For example, it has been found a stroke of approximately 0.8 μm is desirable to achieve adequate phase shift in applications for LIDAR using 1550 nm wavelengths. The stroke of the phase modulator scales linearly with the wavelength.

A second challenge for ribbon-type SLMs used for MEMS phased-array is that the ribbons should include narrow ribbon widths to achieve wide angular swing. Generally, it is suggested that a ribbon used in ribbon-type SLMs for MEMS phased-array applications have a ribbon width of about <5 μm or less, and in some embodiments can be as narrow as 0.5 μm.

These requirements of a large stroke and a narrow ribbon width make it very difficult to switch the ribbon-type SLM at a high rate of speed, which is desirable for beam steering, because narrow ribbons over large air gaps are very poorly damped and can behave like a guitar string, taking a long time to settle and thereby limiting the rate of speed at which the beam can be steered.

Figure 11:
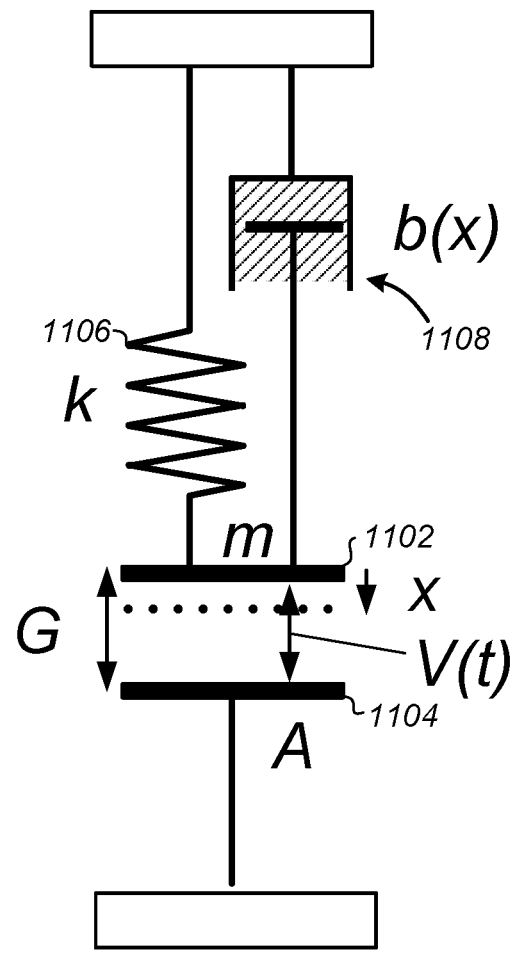
FIG. 11 is a schematic diagram modeling a ribbon of the ribbon-type SLM of FIGS. 7A and 7B as a capacitor-on-a-spring.

The impact of air gap and ribbon width on settling time will now be described with reference to FIG. 11. FIG. 11 is a schematic diagram modeling a ribbon of ribbon-type SLM as a capacitor-on-a-spring. Referring to FIG. 11, a voltage potential V(t) applied between a ribbon 1102 and a grounded lower or substrate electrode 1104 creates an electrostatic Coulomb attraction that deflects the ribbon a distance x towards the substrate electrode. The electrostatic force is balanced by an elastic restoring force (represented by a spring 1106 in FIG. 11). The elastic restoring force, which is due to the taut silicon-nitride film the mechanical layer (shown as mechanical layer 720 in FIG. 7B), allows the ribbon 1102 to revert back to a neutral state or position once the electrostatic force is removed. In addition there is a damping force (represented by a damper 1108 in FIG. 11), arising from squeeze-film effects which is proportional to the instantaneous velocity of the ribbon and slows or damps movement of the ribbon 1102. Squeeze-film damping is a strong function of both ribbon width and air-gap thickness. Settling time is proportional to the cube of the air-gap thickness, and inversely proportional to the cube of the ribbon width. Thus, to achieve adequate damping with narrow ribbons, it is suggested to have a very thin air-gap.

The Coulomb attraction force ($F_{coulomb}$) is given by:

$$F_{Coulomb} = \frac{1}{2} \frac{\varepsilon_0 A V^2}{(G-x)^2} \quad \text{(Eq. 2)}$$

where $\varepsilon_0$ is the permittivity of free space, A is the effective capacitive area of the ribbon in square meters ($m^2$), G is gap thickness, and x is the linear displacement of the ribbon in meters, relative to the substrate electrode.

The Elastic Restoring Force ($F_{Elastic}$) is given by:

$$F_{Elastic} = -kx \quad \text{(Eq. 3)}$$

where k is the spring constant of the mechanical layer, and x is the linear displacement of the ribbon 1102, in meters, relative to the substrate electrode 1104.

The Damping force ($F_{Damping}$) is given by:

$$F_{Damping} = -b\frac{dx}{dt} \quad \text{(Eq. 4)}$$

where b is the damping constant of the air gap, and dx/dt is the velocity of the center of the ribbon 1002, in meters/second, relative to the substrate electrode 1004.

Thus, at equilibrium these three forces, Coulomb attraction, Elastic restoring force and the Damping force, must balance.

However, as the ribbon 1102 displaces past ⅓ a total thickness of the gap (G) between the ribbon in the neutral state and substrate electrode 1104, the electrostatic force can overwhelm the elastic restoring force. This results in a potentially destructive phenomenon commonly referred to as "snap-down" or "pull-in," in which the ribbon 1102 snaps into contact with the substrate electrode 1104 and sticks there even when the electrostatic force is removed. Generally, it has been observed that snap-down occurs at a characteristic displacement of x=G/3, where the ribbon 1102 has been deflected by one third of the original gap thickness. Thus, the ribbons in conventional ribbon-type SLM are typically operated or driven to not be deflected by a distance more than G/3 to prevent snap-down. Unfortunately, this leaves the lower ⅔ of the gap G empty, which in turn leads to poor squeeze-film damping.

Thus, to achieve adequate damping with narrow ribbons, it is desirable to create a very thin squeeze film gap, approaching the physical stroke (x) for the application, while to avoid pull-in it is desirable to create a much larger "electrical gap."

Reducing the squeeze film gap while maintaining or increasing the electrical gap can be done by inserting a dielectric between the ribbon and the substrate electrode. In one embodiment, a solid dielectric film underneath the ribbon is used to improve damping (and heat transfer) in this way. For a dielectric thickness of G, the equivalent electrical thickness is $G/\varepsilon_r$, where $\varepsilon r$ is the relative dielectric constant. For example, for silicon dioxide solid dielectric film having a relative dielectric constant of $\varepsilon_r=3.9$, and a vacuum or air gap having a relative dielectric constant of $\varepsilon_r=1$, to increase the electrical gap by 1 μm, it is necessary to provide nearly an additional 4 μm of a dielectric material over the substrate electrode between the ribbon and substrate electrode. It is noted that integrating thick films, i.e., films having a thickness greater than about 2 μm, into an existing MEMS process used to fabricate ribbon-type SLMs can be difficult or impractical, since intrinsic film stresses can cause such thick films to void or delaminate, and film roughness can become excessive with increased thickness. For this reason, a low dielectric constant material is frequently used.

In another embodiment, the squeeze film gap is reduced while maintaining or increasing the electrical gap by use of an electrically permeable damping structure formed over the substrate electrode during fabrication. Generally, the electrically permeable damping structure includes a dielectric layer suspended above and separated from the substrate electrode by a first gap or first air-gap, where the dielectric layer defines at least a top surface of the air-gap. It is noted that although this first gap is referred to as an air-gap, it need not be filled with air, but can alternatively be evacuated or filled with a mixture of other gases. In some embodiments, the dielectric layer can substantially surround the air-gap to form a hermetic or hermetically sealed cavity. In other embodiments, the first air gap is open to the MEMs environment, including a second gap or air-gap between the electrically permeable damping structure and a lower surface of the ribbons, and the entire environment of the ribbon-type SLM can be evacuated or filled with fill gases and hermetically sealed. Suitable fill gases can include pure form or mixtures of one or more of Nitrogen, Hydrogen, Helium, Argon, Krypton or Xenon.

Figure 12:
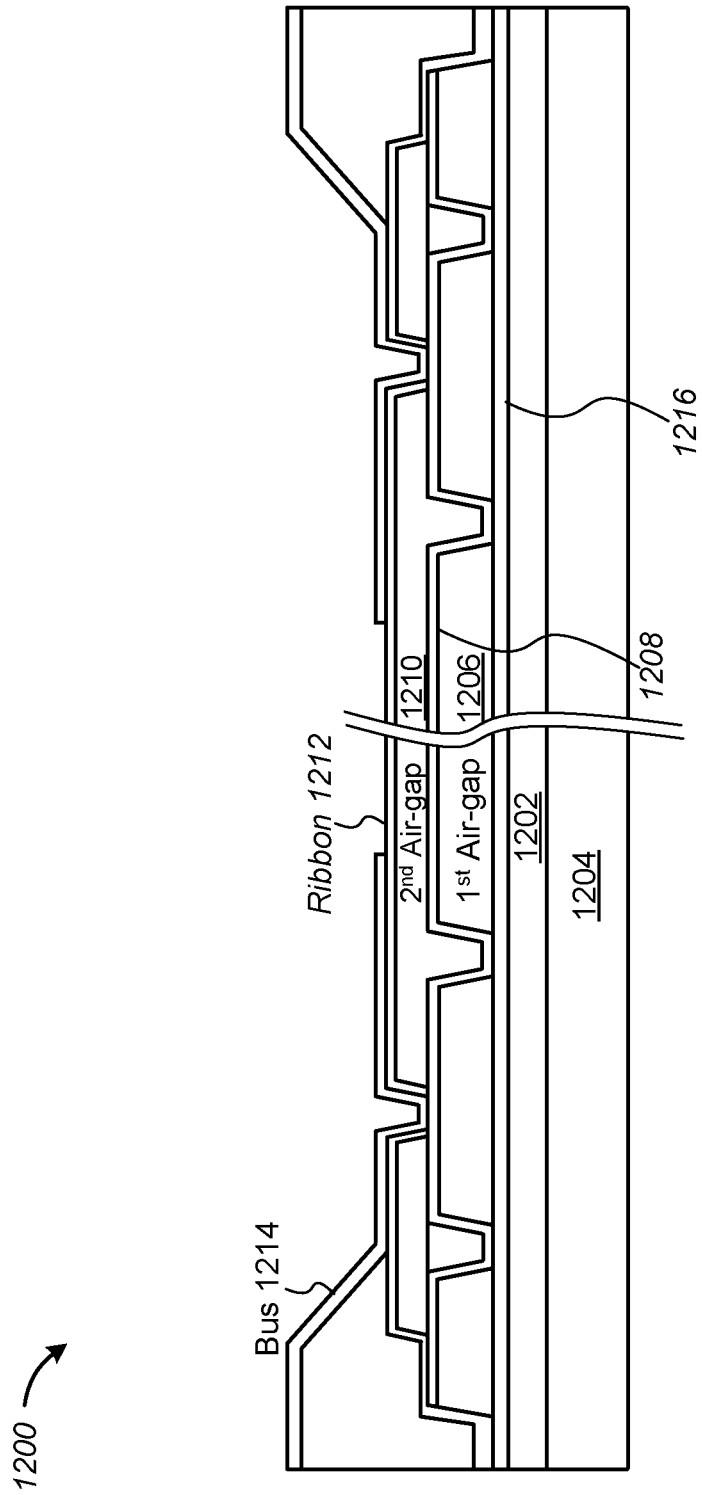
FIG. 12 is a sectional side view of a portion of the SLM of FIGS. 7A and 7B including a damping structure.

In one embodiment, a ribbon-type SLM includes an electrically permeable damping structure to provide a large stroke while maintaining good damping, thereby enabling fast beam steering and large scan angles, and exceeding the wavelength of the light being modulated or steered to accommodate light having long wavelengths of up to about 10 μm. FIG. 12 is a sectional side view of a portion of the ribbon-type SLM of FIGS. 7A and 7B including such a damping structure. Referring to FIG. 12 the ribbon-type SLM 1200 includes a bottom or lower electrode 1202 formed over a substrate 1204, and a static, electrically permeable damping structure formed over the bottom electrode. Generally, the electrically permeable damping structure includes a first air-gap 1206 and a dielectric layer 1208 suspended above and separated from the lower electrode 1202 by the first air-gap, and a second air-gap 1210 above the dielectric layer separating movable lengths of a plurality of ribbons 1212 of the ribbon-type SLM 1200 from the dielectric layer. As in the embodiments of the ribbon-type SLM described in connection with FIGS. 6A and 6B, each of the ribbons 1212 include a mechanical layer, typically formed from a taut layer of silicon nitride, and a ribbon or top electrode coupled through a bus 1214 to one of number of drive channels (not shown), and are configured to deflect towards the bottom electrode by electrostatic force generated between the top and bottom electrodes. Generally, as in the embodiments of FIGS. 7A and 7B the drive channels are integrally formed on the same substrate 1204 as the linear array of ribbons 1212.

Optionally, as in the embodiment shown, the device can further include a thin intermediate dielectric layer 1216, such as a silicon-dioxide between the substrate 1204 and the lower electrode 1202 to electrically insulate the lower electrode.

In operation, the ribbons 1212 are independently deflectable towards the bottom electrode 1202 by a distance substantially equal to a thickness of the second air-gap 1210. Generally, the thickness of the second air-gap 1210 is ~G/3, and the thickness of the first air-gap 1206 is ~2G/3, where G is a distance between the bottom electrode 1202 and the ribbons 1212 in an undeflected or quiescent state. It has been found that for a ribbon-type SLM 1200 with ribbons 1212 having a width transverse to a long axis of the linear array of from 10 μm to 0.5 μm, and operating at near infrared wavelengths suitable for LiDAR applications, an electrically permeable damping structure such as described above and having a first air gap 1206 of about 2.5 μm and a second air-gap 1210 up to about 1.5 μm, improves settling time, while maintaining a high switching speed and substantially preventing pull-in or snap-down of the ribbons 1212. Note that the ratio of second air-gap thickness to first air-gap thickness can be decreased to accommodate narrower ribbons which require stronger damping. By changing the thickness ratio but maintaining the same total thickness (first air-gap+second air gap) the total desired stroke is maintained.

Figure 13:
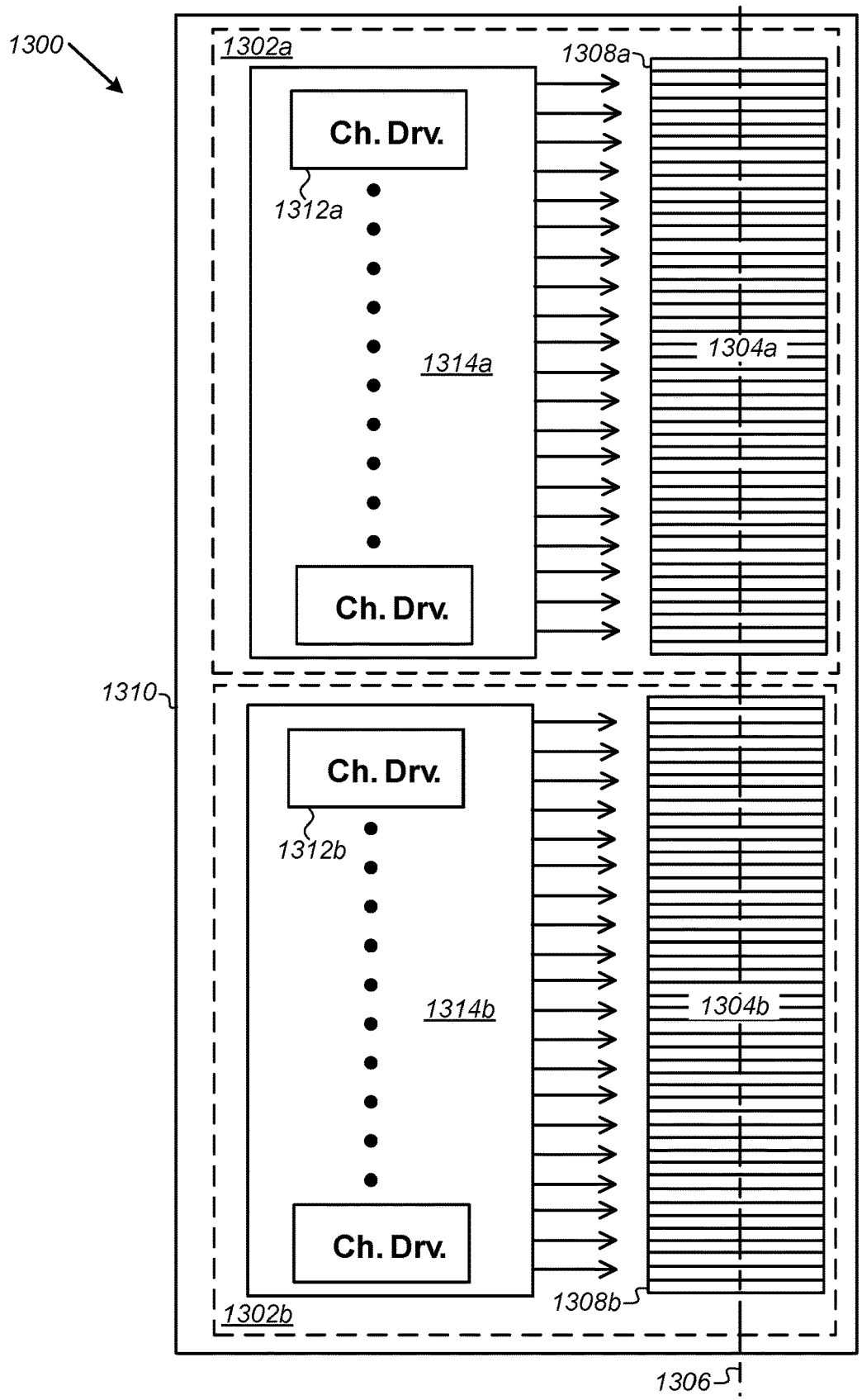
FIG. 13 is a diagram illustrating a top view of an embodiment of a MEMS phased-array including multiple ribbon-type SLMs with one dimensional (1D) arrays stacked to increase an axial dimension parallel to a long axis of the MEMS phased-arrays over which modulated light can be scanned.

In one embodiment, such as that shown in FIG. 13, the MEMS phased-array 1300 can include multiple ribbon-type SLMs 1302a, 1302b, each with a one dimensional (1D) array 1304a, 1304b, arranged in a line along a common or shared long axis 1306 and operated to increase an area over which modulated light can be scanned, and stacked to increase an axial dimension parallel to the long axis of the arrays. Referring to FIG. 13, each of the arrays 1304a, 1304b, includes hundreds or thousands of free-standing, addressable electrostatically actuated ribbons 1308a, 1308b. As with the ribbon-type SLM 700 described above with respect to FIGS. 7A and 7B, each of the ribbons 1308a, 1308b, has a light reflective surface, includes an electrode and is deflectable through a gap or cavity toward a substrate 1310 by electrostatic forces generated when a voltage is applied between the electrode in the ribbon and a base electrode in the substrate. Each of the ribbons 1308a, 1308b, is driven by a drive channel 1312a, 1312b in a driver 1314a, 1314b, which may be integrally formed on the same substrate 1310 with the arrays 1304a, 1304b.

In some embodiments, such as that shown, each of the ribbon-type SLMs 1302a, 1302b, including the arrays 1304a, 1304b and drivers 1314a, 1314b, are integrally formed on a single, shared substrate 1310. Alternatively, each of the ribbon-type SLMs 1302a, 1302b, can be integrally formed on separate substrates, which are then packaged in a single, share integrated circuit (IC) package. In yet another alternative embodiment, each of the ribbon-type SLMs 1302a, 1302b, are separately packaged and then mounted to a single, shared printed circuit board (PCB).

Figure 14:
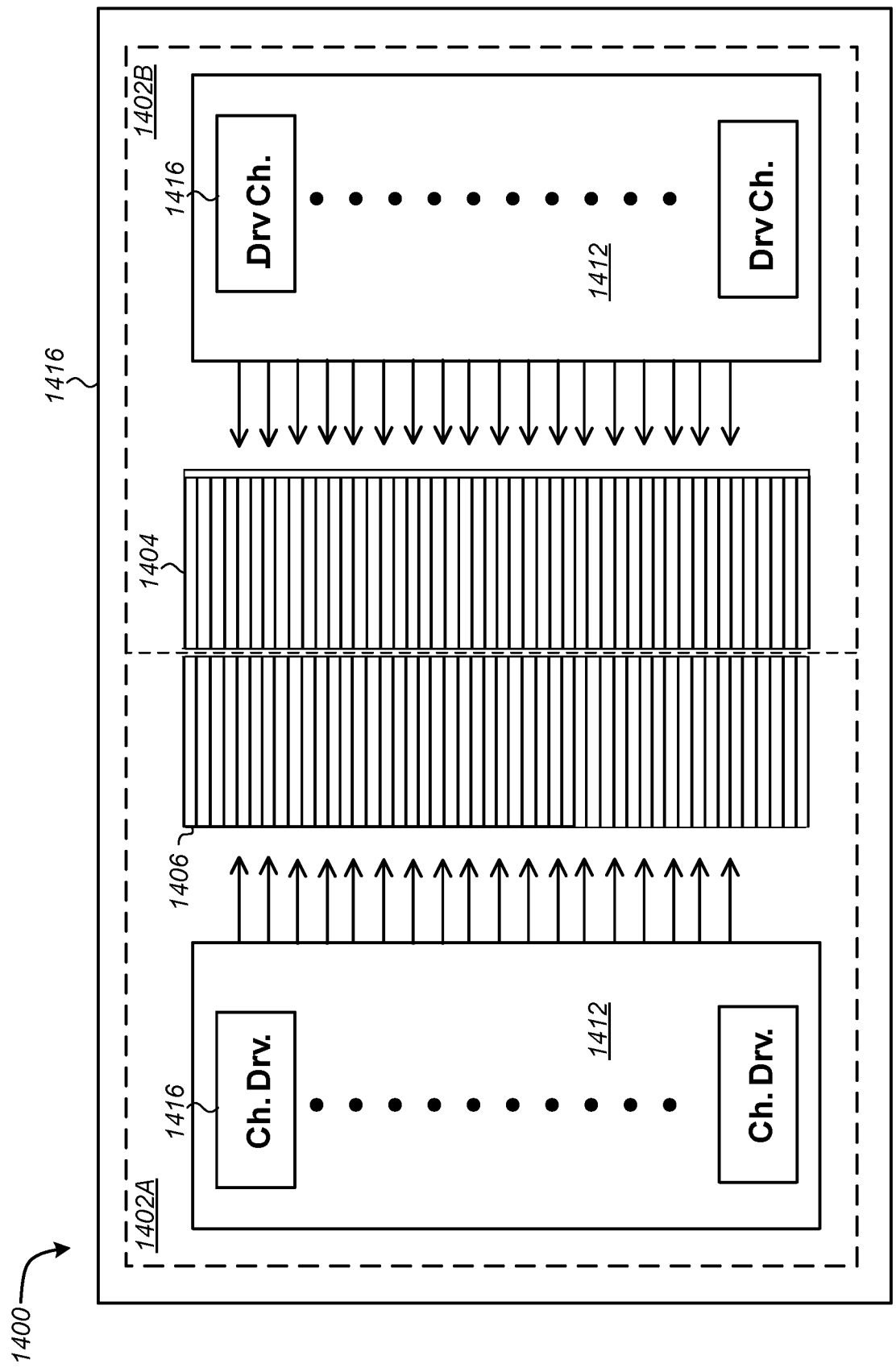
FIG. 14 is a diagram illustrating a top view of an embodiment of a MEMS phased-array including multiple ribbon-type SLMs with one dimensional (1D) arrays arranged in parallel.
Figure 15A:
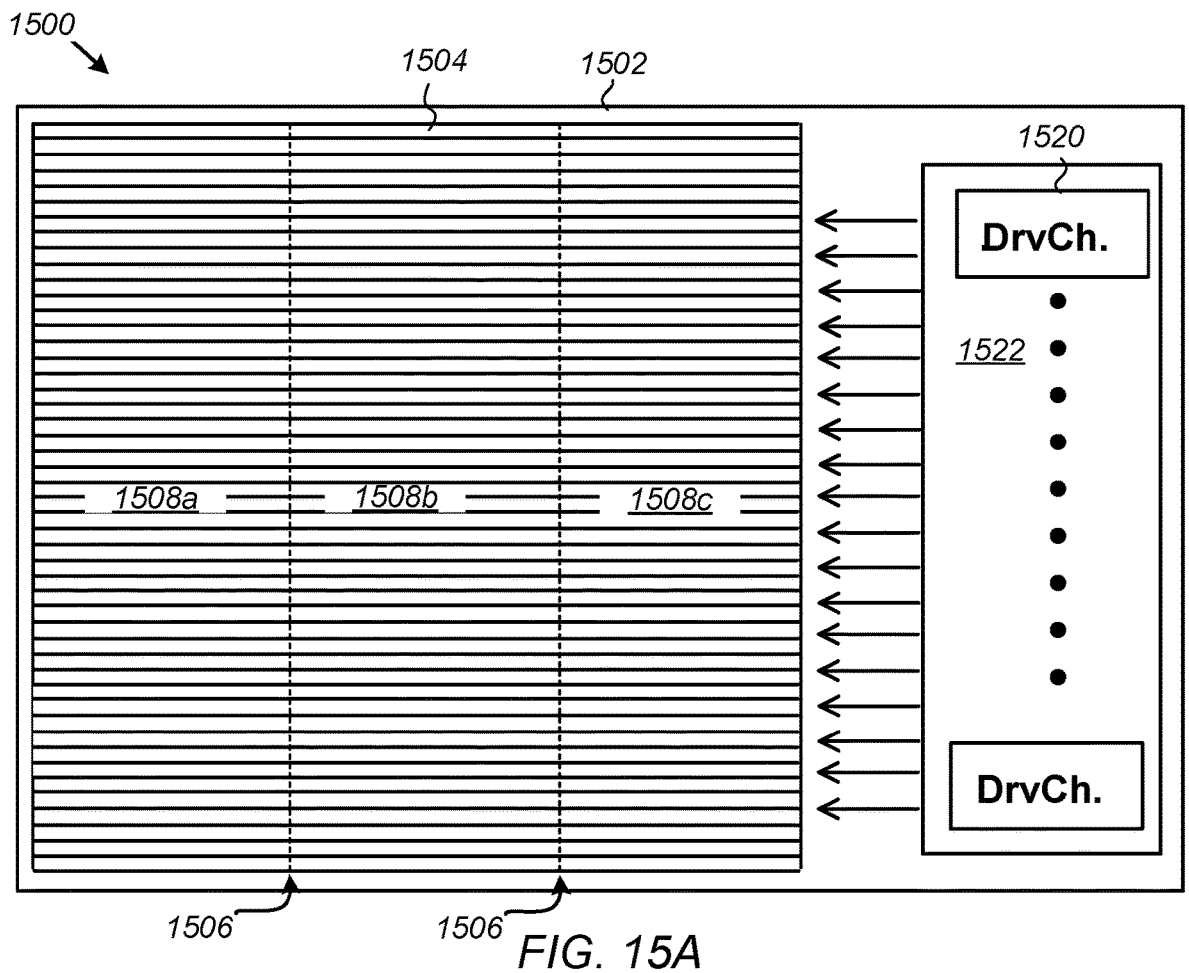
FIGS. 15A through 15C are diagrams illustrating another embodiment of a MEMS phased-array including a single ribbon-type SLM in which each of the ribbons of the SLM are divided by posts along a length thereof to form a plurality of parallel 1D arrays.
Figure 15B:
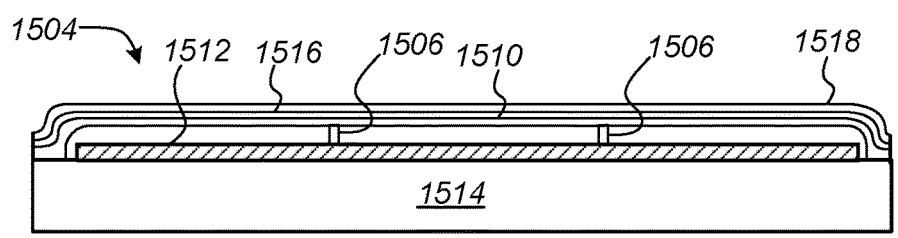
Figure 15C:
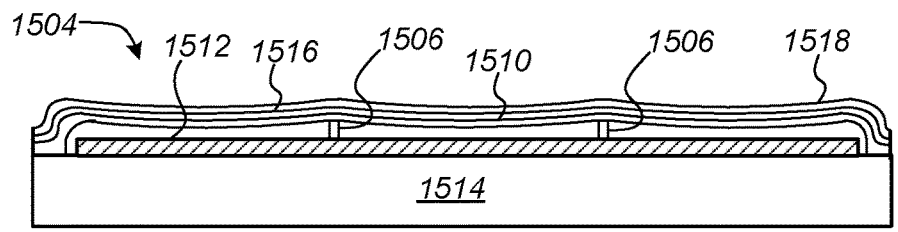

In other embodiments, shown in FIG. 14 and in FIGS. 15A through 15C, the MEMS phased-array can include multiple ribbon-type SLMs or a single ribbon-type SLM having multiple one dimensional (1D) arrays arranged and operated in parallel to increase the active aperture of the optical scanner. Increasing the functional area of the MEMS phased-array in this manner allows for simpler optics, enables an increased field of view (FOV) and system point spread resolution, as well as increased sensitivity by collecting more light in de-scan operations.

FIG. 14 is a diagram illustrating a top view of an embodiment of a MEMS phased-array 1400 including multiple ribbon-type SLMs 1402A and 1402B each including an array 1404 of a plurality of ribbons 1406 arranged in parallel. Generally, as in the embodiment shown the ribbon-type SLM 1402A and 1402B are integrally formed on a shared substrate 1408, and the ribbons 1406 are driven by drive channels 1416 in drivers 1418, which may be integrally formed on the same substrate 1408 with the arrays 1404. Alternatively, in an embodiment not shown all of the multiple ribbon-type SLMs 1402A and 1402B can be driven by a single shared driver 1418.

FIGS. 15A through 15C are diagrams illustrating another embodiment of a MEMS phased-array 1500 including a single ribbon-type SLM 1502 in which each of the ribbons 1504 of the SLM are divided by posts 1506 along a long axis thereof to form a plurality of parallel 1D arrays 1508a, 1508b, and 1508c. Although only three parallel 1D arrays 1508a, 1508b, 1508c are shown it will be understood that the ribbon-type SLM 1502 can be divided into any number of parallel 1D arrays from 2 to over 50. A schematic sectional side view of a movable ribbons 1504 of the SLM 1502 of FIG. 15A in an undeflected or quiescent state is shown in FIG. 15B. A schematic sectional side view of a movable ribbons 1504 of the SLM 1502 of FIG. 15A in a deflected or active state is shown in FIG. 15C. As with the embodiment of the SLM 700 described with respect to FIGS. 7A and 7B, the ribbon 1504 includes an elastic mechanical layer 1510 to support the ribbon above a bottom electrode 1512 formed on a surface of a substrate 1514, a ribbon or top electrode 1516 and a reflective layer 1518 including a light reflective surface overlying the mechanical layer or top electrode. Generally, as shown in the embodiment of FIG. 7A the SLM 1502 further includes a number of drive channels 1520 in a driver 1522 integrally formed on the same substrate 1514 as the linear 1D arrays 1508a, 1508b, and 1508c.

In another embodiment, the MEMS phased-array includes a blazed grating ribbon-type or ribbon MEMS array, in which each elongated element or ribbon of a ribbon-type SLM has a reflective surface with a blazed profile. By a blazed profile it is meant wherein each of the ribbons have a reflective surface across a width of the ribbon that is angled at the blaze angle relative to a surface of the SLM or surface of a substrate on which the SLM is fabricated. In some embodiments, the reflective surfaces have a stepped profile to produce an effective blaze at a blaze angle. The blaze angle on the ribbon adjusts a power and contrast in modulated light from the SLM in the zeroth ($0^{th}$) and higher orders, providing higher contrast in the $0^{th}$ order, and higher contrast and/or power in the first ($1^{st}$) and higher orders. For scanning operation, using a blazed ribbon in conjunction with the blazed operation or method described above with respect to FIGS. 8 through 10, shifts a center of a "scan envelope" (angles between +/−first orders in an SLM with flat ribbons) towards the first order, and away from the zeroth ($0^{th}$) and order or incidence angle. An advantage of shifting the center of a "scan envelope" is that any reflections from any other surfaces of the SLM exposed through gaps between ribbons will appear only in the zeroth order, and therefore will not be scanned resulting in a more optically efficient system with greater or higher contrast.

Figure 16A:
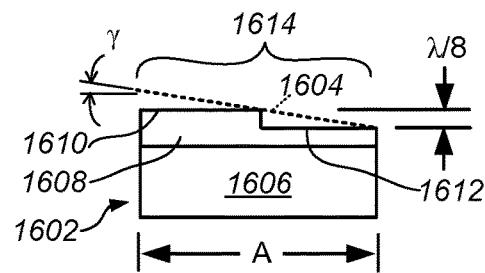
FIG. 16A illustrates a cross section of an elongated element or ribbon of a ribbon-type SLM having a blazed profile according to another embodiment.

An embodiment of a ribbon-type SLM including ribbons with a blazed profile will now be described with reference to FIGS. 16A-16C. FIG. 16A illustrate a cross-sectional view of a single elongated element or ribbon 1602 having a stepped profile to produce an effective blaze surface 1604 at a blaze angle γ at a blaze angle. The ribbon 1602 generally includes a rectangular body 1606 and a stepped reflector 1608. The rectangular body 1606 can include silicon nitride and the stepped reflector 1608 can include an optically reflective material such as aluminum. The stepped reflector 1608 forms first and second surfaces, 1610 and 1612, of the ribbon 1602. The first and second surfaces, 1610 and 1612, are generally separated by a height difference of an eighth wavelength λ/8 of an incident light to form a blaze profile 1614. The blaze profile 1614 forms the effective blaze surface 1604 at blaze angle γ, where blaze angle γ is given by the expression: $\gamma = \arctan(\lambda/(4A))$.

Figure 16B:
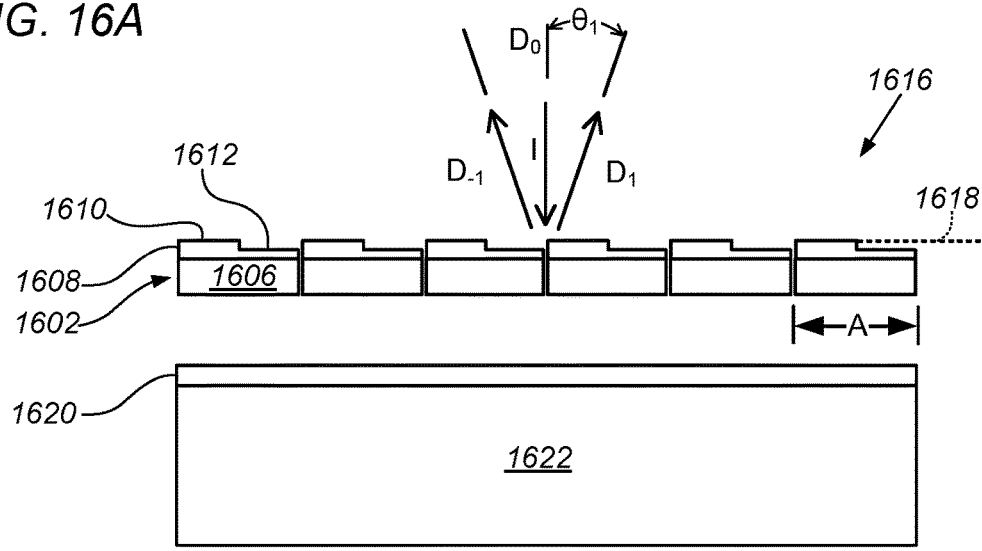
FIGS. 16B and 16C illustrate a cross-sectional view of an embodiment of a ribbon-type SLM including blazed ribbons in a non-activated state and in a fully activated state, respectively.

A first cross-sectional view of a portion of a blazed ribbon-type or ribbon MEMS phased-array 1616 in a non-activated state with the ribbons 1602 on a grating pitch A and with the first surfaces 1610 defining a grating plane 1618 is illustrated in FIG. 16B. In the non-activated state, there is generally a zero electrical bias between the ribbons 1602 and a lower or bottom electrode 1620. The incident light (I) of wavelength λ, illuminates the blazed ribbon MEMS phased-array 1616 at an angle normal to the grating plane 1618, and diffracts light into a number of diffraction orders $D_0$, $D_{-1}$ and $D_1$ based on a profile of the blazed ribbons 1602. In the non-activated state, the zeroth order diffraction, $D_0$, is normal to the grating plane 1618. The diffraction orders $D_1$ and $D_{-1}$ are at a first diffraction angle $\theta_1$ given by the expression: $\theta_1 = \arcsin(\lambda/A)$, where A is the grating pitch of the first and second surfaces, 1610, 1612, of the ribbons 1602. For the embodiment shown having first and second surfaces, 1610, 1612, separated by a height difference of an eighth wavelength λ/8 the diffraction angle $\theta_1$ is approximately four times the blaze angle γ, or less than about 15°. Neglecting a first light loss due to absorption by the stepped reflectors 1608 and a second light loss by the incident light I passing through gaps between adjacent pairs of the ribbons 1602, half of the light incident on the blazed ribbon MEMS phased-array 1616 is diffracted into the zeroth diffraction order, $D_0$, while a quarter of the incident light I is diffracted into each of the first diffraction orders $D_1$ and $D_{-1}$.

Figure 16C:
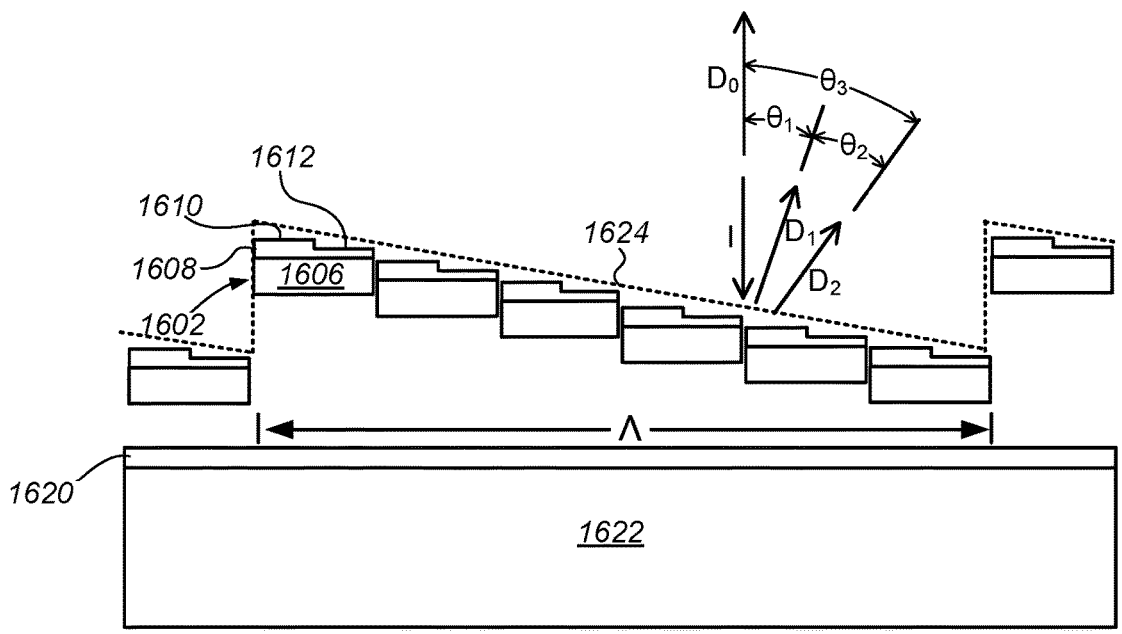

A second cross-sectional view of the blazed ribbon MEMS phased-array 1616 in an activated state in which the ribbons 1602 are moved towards a substrate 1622 by applying an electrical bias between the ribbons and the bottom electrode 1620 is illustrated in FIG. 16C. Generally, as in the embodiment shown the blazed ribbon MEMS phased-array 1616 is operated using a blazed operation or method similar to that described above with respect to FIGS. 8 through 10. Referring to FIG. 16C, in order to steer a normally incident beam (I) through a first order of a reflected steering angle $\theta_3$, ribbons 1602 having a blaze profile 1614 are arranged in a "blaze" pattern 1624 of pitch or period Λ. In the activated state, the incident light I of the wavelength λ is diffracted into a first angle, $\theta_1$, by the profile of the blazed ribbons 1602 as described above, and further diffracted or steered by a first order diffraction angle $\theta_2$ produced by the blaze pattern 1624, and given by the expression: $\theta_2 = \arcsin(\lambda/\Lambda)$, where Λ is the blaze pitch Λ is of the blaze pattern 1624. Note, that the blaze period Λ can assume integer or non-integer values to allow continuous modulation of the steering angle $\theta_3$. As the blaze pitch Λ is reduced, light is steered over larger angles from $\theta_1$ to $\theta_3$.

Figure 17:
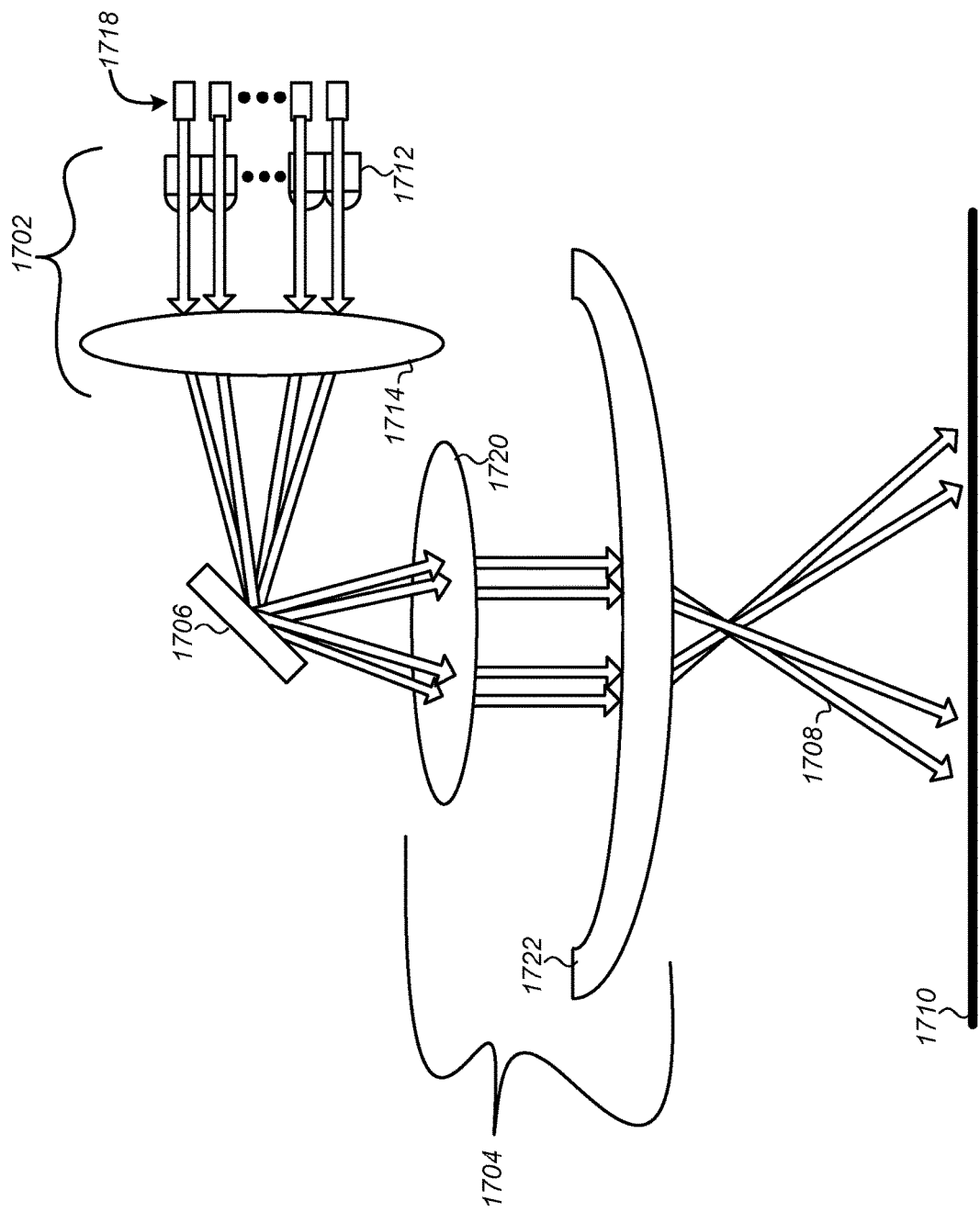
FIG. 17 is an optics diagram illustrating illumination and projection optics for an optical scanner including a MEMS phased-array to steer light to scan a far field scene.

FIG. 17 is an optics diagram illustrating illumination optics 1702 and projection optics 1704 for an optical scanner including a number of MEMS phased-arrays 1706 to steer light 1708 to scan a far field scene 1710. In the embodiment shown in FIG. 17 the illumination optics 1702 can include a lenticular array or an array of microcylinder lenses 1712 to form individual columns of light from a coherent light source, and an imaging lens 1716 to focus the collimated light onto individual modulators of the MEMS phased-array 1706. In the embodiment shown, the light coherent light source includes an array of light emitting devices such as VCSEL lasers 1718. In a pulsed or flash LiDAR in which the coherent light source is generated using an a VCSEL array 1718 the illumination optics 1702 and projection optics 1704 can achieve greater than 5 watts (W) peak power with 10 nanosecond (ns) pulse, at a repetition rate of up to 1 MHz, while each beam of light projected into the far field scene has an average power less than about 2.5 microwatts (mW) and thus is eye safe.

The projection optics 1704 can include one or more lenses, such as a Fourier lens 1720 and a fish-eye lens to spread the light from the MEMS phased-array to the far field scene in at least an angular dimension, transverse to an axial dimension over which light is scanned by phase modulation of the MEMS phased-array 1706. Referring to FIG. 17, in a pulsed or flash LiDAR in which the coherent light source is generated using an a VCSEL array 1718 the illumination optics 1702 and projection optics 1704 can achieve greater than 5 watts (W) peak power with 10 nanosecond (ns) pulse, at a repetition rate of up to 1 MHz, while each beam of light projected into the far field scene has an average power less than about 2.5 microwatts (mW) and thus is Class 1, eye safe. Furthermore, for a MEMS phased-array 1706 having an individual element size 4.25 µm with an enclosure aperture of 3 mm the MEMS phased-array is capable of providing a FOV of 25.5 degrees, with over 1000 resolvable lines.

In some embodiments, at least one of the illumination optics or the projection optics or receiving optics includes anamorphic optics for focusing light from a light source onto a MEMS phased-array, and/or focusing modulated light from the MEMS phased-array into the far field scene. Anamorphic optics are desirable to provide a vertical or transverse numerical aperture (NA) along a vertical axis of the MEMS phased-array, transverse to the direction over which the light is scanned, that is smaller than a diffraction angle of the modulated light reflected from the array along a vertical or transverse axis of the scan direction, and a horizontal or longitudinal NA along the horizontal or longitudinal axis of the array that is greater than the vertical or transverse NA, as the field of view and resolution requirement for the vertical and horizontal axis may differ. The horizontal axis optics will match the FOV of the phased-array device to the requirements of the horizontal scan of the system, while the FOV of the vertical scan is determined by the vertical numerical aperture as set by the illuminating or detector array system.

Figure 18A:
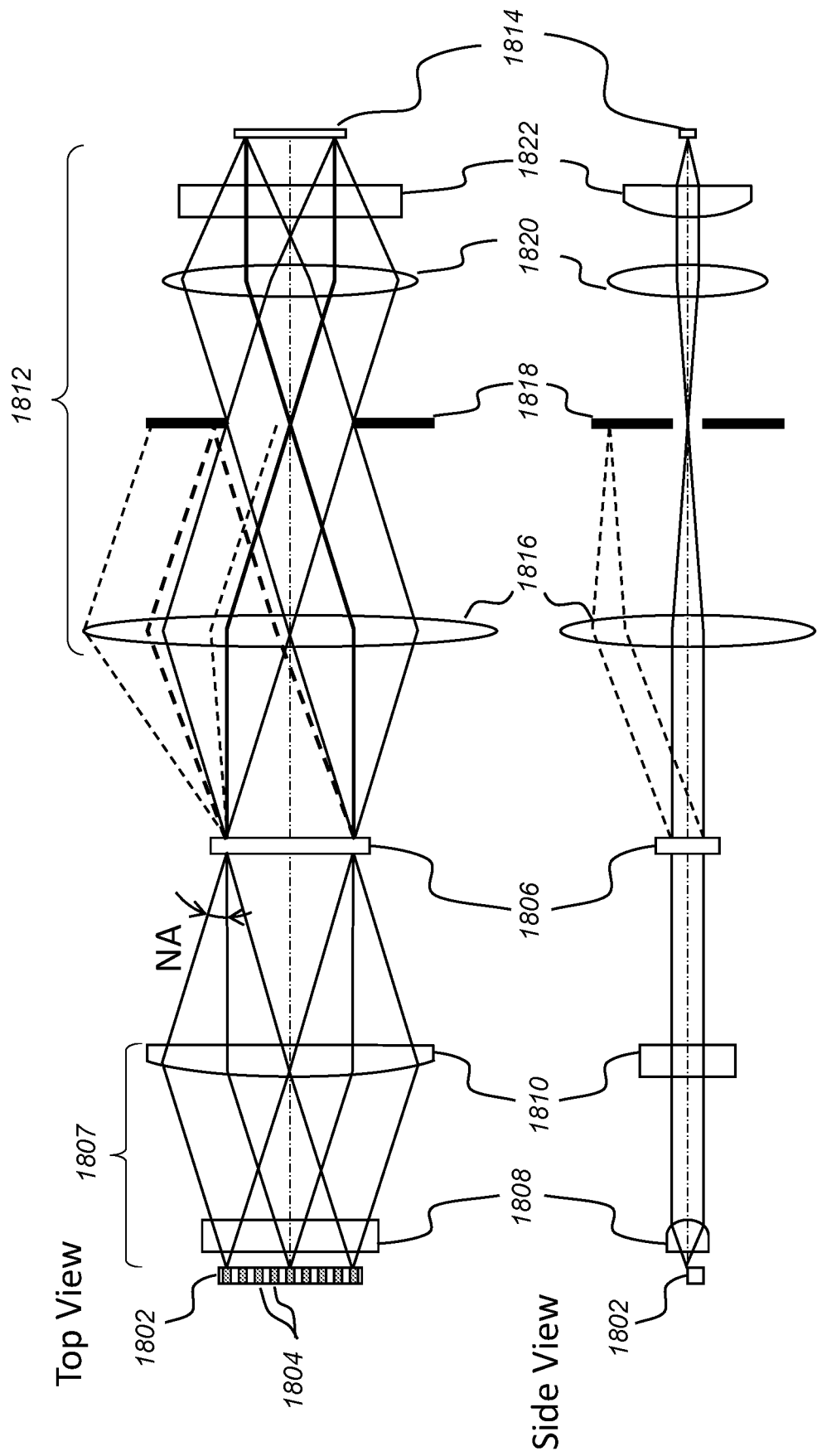
FIG. 18A is an optics diagram illustrating illumination and projection light paths of a single pixel along a horizontal or longitudinal axis optics for an optical scanner including a MEMS phased-array to steer light to scan a far field scene.
Figure 18B:
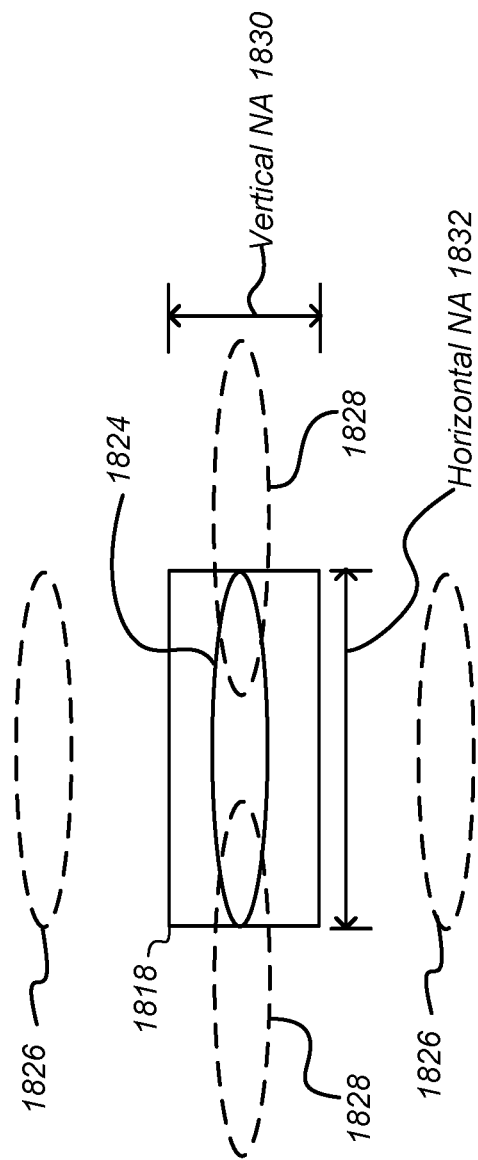
FIG. 18B is an optics diagram illustrating $0^{th}$ order beam and diffracted $+/-1^{st}$ order beams on the Fourier aperture of the projection optics illustrated in FIG. 18A.

FIGS. 18A and 18B are an optics diagram illustrating both top and side views of light paths for anamorphic illumination and imaging optics according to an embodiment of the present disclosure. The top view shows an optical paths along a pixel arranged direction. Referring to FIG. 18A, the light path begins at a light source, such as a laser 1802 shown, in this embodiment, as including a plurality of light emitting or laser diodes 1804 arranged as a bar laser to illuminate a substantially linear portion of a 1D or 2D array 1806 of an SLM through anamorphic illumination optics 1807, including a first optical element or lens 1808 and second optical element or lens 1810. Although in the embodiment shown the anamorphic illumination optics 1807 are depicted or represented by two single lenses 1808 and 1810, it will be appreciated that the anamorphic illumination optics can include any number of prisms, lenses and to refract and transmit light from the laser 1802 to the linear array 1806 to fully illuminate the linear array. The lens 1808 is usually called FAC lens (Fast Axis Collimator) to collimate laser from the emitters along the vertical axis or fast axis of emitters. In the embodiment shown, the laser 1802 is a bar laser including multiple semiconductor diode lasers or emitter arranged along common long axis. Each emitter of the bar laser works as spatially single mode laser and it has Gaussian beam profile along the vertical axis. As shown in side view in FIG. 18A, it is possible to achieve a nearly ideal collimated beam. As the size of modulator along the vertical axis is one or several millimeters, focusing optics or reduction optics are not required. This means the beam of illumination NA along the vertical direction is almost zero. If an optical device like Powell lens is inserted to convert the Gaussian to Top-hat profile, it is possible to evenly illuminate modulators which are arranged vertically in a single pixel. In the top view in FIG. 18A the optical element or lens 1810 works for illumination of whole a spatial right modulators array along the horizontal axis. A light pipe or a fly eye lens array can be included in the optical element or lens 1810 to homogenize the light from the light emitting or laser diodes 1804 of the bar laser. As a bar laser has multiple emitters and generally has 10 mm width along the horizontal axis, it functions to some degree as a NA. In the instance in which the optical element or lens 1810 is a single cylindrical lens, the NA would be D/2f, where D is size of the bar laser and f is the focal length of the cylindrical lens in the optical element or lens 1810. When an optical device to homogenize illumination is inserted in the optical element or lens 1810, the NA number would be extended. Thus, while NA along the fast axis or vertical axis is low, NA along the slow axis or horizontal axis could be much bigger than the fast axis.

As disclosed in the FIG. 18A, the pixel arranged direction of the linear array 1806 is set parallel to emitter arranged direction of the bar laser 1802. Such the configuration enables to use diffraction beams effectively. When the focus is on the horizontal axis, the NA of illumination optics has some number because of the size of emitter array, while the condition to separate diffraction beams by the linear array 1806 is limited. The imaging optics 1812 can include magnification elements, such as a Fourier Transform (FT) lens 1816, and Fourier aperture 1818. As described above, the array includes just one or a few pixels along the horizontal direction and $1^{st}$ order beams can be separated from $0^{th}$ order beam only when the illumination NA is almost zero. Therefore a part of $1^{st}$ order beam interfere the $0^{th}$ order beam. In FIG. 18A the dashed lines illustrate $1^{st}$ order beams while the solid, bold line show the main, $0^{th}$ order beams. Since the NA of illumination beam is kept after it is diffracted to $1^{st}$ order beam by the linear array 1806, some of the $1^{st}$ order beams pass through the Fourier aperture 1818. On the other hand, NA of illumination optics along the vertical axis is small and the number of modulators in a single pixel is so large that diffraction, main beams are separated.

Modulated light from the linear array 1806 is then transmitted through imaging optics 1812 to the imaging plane 1814. In some embodiments, such as that shown in FIG. 18A, the imaging optics 1812 can also include anamorphic optics, represented here by anamorphic lens 1820 and microlens or lenticular array 1822. This embodiment is particularly advantageous where the pixel size of array 1806 is not square. By using or adding anamorphic imaging optics to the imaging optics 1812 a reduced image of the linear array is projected on the imaging plane along the vertical direction, thereby correcting or compensating for any distortion or non-square pixels in the of linear array 1806.

FIG. 18B shows that $0^{th}$ order beam and diffracted +/−$1^{st}$ order beams on the Fourier aperture 1818. Referring to FIG. 18B, ellipse 1824 represents the $0^{th}$ order beam, while ellipse 1826 represent $1^{st}$ order beams along the vertical direction, and ellipse 1828 represent $1^{st}$ order beams along the horizontal direction. The aperture size along the vertical axis (vertical NA 1830) is equivalent to the diffraction angle of $1^{st}$ order beam and a size of the $0^{th}$ order beam (represented by ellipse 1824) along the horizontal axis is the same as the horizontal NA 1832 of illumination optics (lenses 1808 and 1810 in FIG. 18A). Referring again to FIG. 18B, it is seen that the $0^{th}$ order beam (represented by ellipse 1824) can pass through the Fourier aperture 1818 while the +/−$1^{st}$ order beams along the vertical axis (represented by ellipse 1826) are completely blocked, and the +/−$1^{st}$ order beams along the horizontal axis (represented by ellipse 1828) are substantially blocked or significantly reduced in power. This results in a slightly degraded contrast ratio (CR). Thus, the illumination and imaging optics of the embodiment of FIG. 18A is suitable for use in a LiDAR S system, such as that shown in FIGS. 1 and 3.

The power of bar lasers including a plurality of laser diodes is not as high as in the examples given above, and is generally equal to or less than 100 watts (W). In order to increase a total illumination power multiple bar lasers should be used. Thus, in some embodiments a vertical stack of bar lasers can be used to achieve higher powers.

Figure 19:
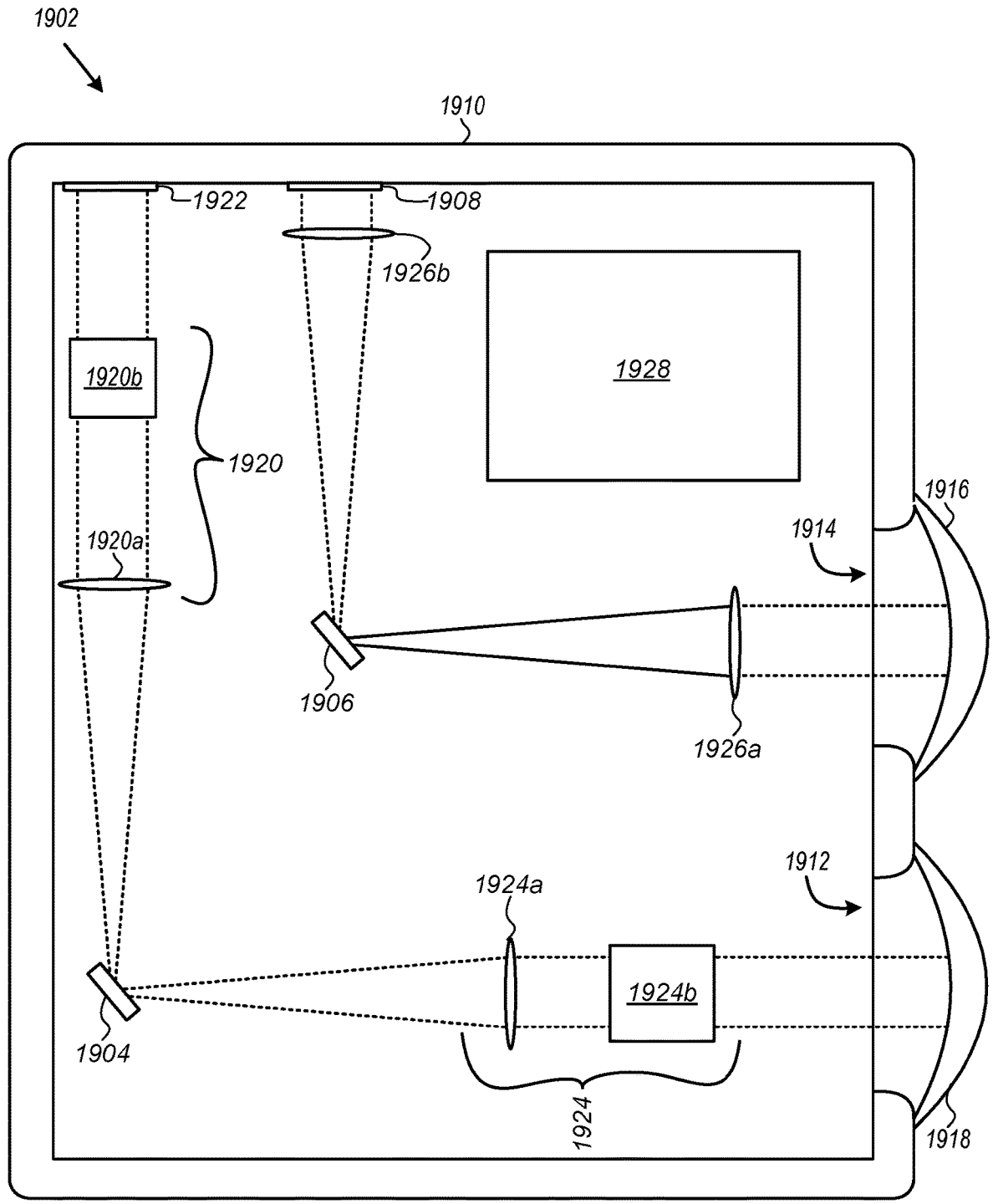
FIG. 19 is a schematic block diagram of a compact optical scanner including a compact MEMS phased-array and illustrating folded light paths for illumination, projection and receiving optics.

FIG. 19 is a schematic block diagram of a compact optical scanner 1902 shown in a cut-away view, and including one or more MEMS phased-arrays 1904, 1906, and illustrating folded light paths for illuminating the MEMS phased-arrays, projecting modulate light therefrom, and receiving and de-scanning light onto a detector 1908. As shown in FIG. 19, the folded light paths enable a compact optical scanner 1902 size, for example of about 7 cm by 7 cm with a thickness of about 2 cm, or about the size of a deck of cards.

Referring to FIG. 19, the optical scanner 1902 includes a housing or enclosure 1910, and one or more openings or apertures 1912, 1914, through which light can be projected to scan a far field scene (not shown in this figure) and received back from the far field scene. Generally, the apertures 1912, 1914, are covered or sealed by lenses 1916, 1918, to further magnify or expand the projected light, to focus the received light, and/or to provide an environmentally sealed enclosure 1910 for the optical scanner 1902. In some embodiments, such as that shown, the lenses 1916, 1918, can include fish-eye lenses to further increase a field of view (FOV) of the optical scanner 1902.

The optical scanner 1902 further includes illumination optics 1920 to direct light from a coherent light source 1922 on to the MEMS phased-array 1904, imaging or projection optics 1924 to transmit or project phase modulated light from the MEMS phased-array into the far field scene, and receiving optics 1926 to receive and direct light from the far field scene onto the detector 1908. As in embodiments described above the light source 1922 can include any type and number of light emitting devices, such as lasers, diode lasers or VCSELS. The illumination optics 1920 can comprise a number of elements including one or more lenses 1920a, and integrators, mirrors or prisms 1920b, configured to transfer light from the light source 1922 to the MEMS phased-array 1904 to illuminate a line of a specified width and covering substantially a full width length of the MEMS phased-array. The projection optics 1924 can also include lenses 1924a, and integrators, mirrors or prisms 1924b, configured to transfer light from the MEMS phased-array 1904 to illuminate a line or swath in the far field scene. Like the illumination and projection optics, the receiving optics 1926 can include one or more lenses 1926a, 1926b, integrators, mirrors and/or prisms configured to receive and transfer light from the far field scene to the onto the detector 1908. Generally, the detector 1908 can comprise any type of detector sensitive to coherent light in the wavelengths generated by the light source 1922, including a rolling shutter camera or cameras, a one or two dimensional array of photodiode detectors, or a SPAD array.

Finally, the enclosure 1910 of the optical scanner 1902 can further include or house electronic circuits 1928 necessary for the operation of the optical scanner, such as a controller, power supplies for the controller, light source 1922, MEMS phased-arrays 1904, 1906, and detector 1908, one or more memories and interfaces to a host system.

As noted above, one or more of the illumination optics 510, projection optics 514, receiving optics 518, and detector optics 524 can include a microlens or lenticular array. In particular, illumination optics in the transmitter including a lenticular array is useful in conjunction with a light source including a VCSEL array, as shown in FIG. 17, to provide independent optical channels. A lenticular optical array is also particularly useful distribute light on the multiple ribbon MEMS phased-arrays, either in the optical transmitter or receiver, such as those shown in FIGS. 13 through 15, to distribute light on the multiple arrays, and/or in projection optics to disperse to form the swath of illumination in the far field scene. Finally, a lenticular array is useful in receiver array optics to increase an effective fill factor of the receiver array.

An embodiment of a lenticular array suitable for use in some or all of these applications will now be described with reference to FIGS. 20A through 20C. FIG. 20A is a schematic block diagram illustrating a top view of an embodiment of a lenticular array, FIG. 20B is a cross sectional view of the lenticular array of FIG. 20A, and FIG. 20B illustrates 0th order illumination of a single modulator in a ribbon MEMS phased-array by single element of the lenticular array of FIG. 20A. Referring to FIG. 20A the lenticular array 2000 includes a molded surface forming multiple individual lenses or elements, such as micro-lenses or cylindrical lenses, configured to concentrate, either focus or project, light more in one direction than in another. In the embodiment shown the lenticular array 2000 is adapted or configured to focus light onto individual ribbons or portions of ribbons divided by posts in a ribbon MEMS phased-array 2002, and the individual lenses or elements include cylindrical lenses 2004, each having a long axis parallel to a long axis 2006 of one or more ribbon MEMS phased-array arranged either stacked as shown in FIG. 13 or arranged in parallel as shown in FIGS. 14 and 15, and perpendicular to a long axis 2008 of the ribbons. As shown in the cross-sectional view of the lenticular array 2000 in FIG. 20B the cylindrical lenses 2004 focus or concentrate incoming light 2010 on a center of each individual ribbon or portion of a divided ribbon in the ribbon MEMS phased-array 2002.

Referring to FIG. 20C, when a difference in electrostatic potential is applied between an active ribbon 2012 and substrate or lower electrode in a ribbon MEMS phased-array, the ribbon is deflected into a parabolic profile as shown. As a result the diffraction grating is established only in a narrow region near the center-line of the ribbon 2012. Regions outside this optical "sweet-spot 2014" are neither parallel to a surface of the ribbon MEMS phased-array nor displaced by the desired amount and therefore cannot provide efficiency steering. For this reason, it is desirable to use a lenticular array 2000 to carefully shape or focus illumination onto a central portion of the ribbons of the ribbon MEMS phased-array, or to collimate and project only light modulated from the central portion of the ribbons. A rule of thumb is that a width of sweet-spot 2014 should be roughly on the order of $1/10^{th}$ to $1/3^{rd}$ the length the ribbon 2012, depending on the contrast ratio. Additionally, with particular regard to light gathered by receiving optics and focused onto a ribbon MEMS phased-array in the optical receiver, or de-scanned by the ribbon MEMS phased-array and focused onto a detector, the individual lenses or elements enable only a $0^{th}$ order of light 2016 to focused on or modulated by the sweet-spot 2014 while rejecting other orders of light 2018, thereby increasing contrast and resolution of the optical scanner.

Figure 21:
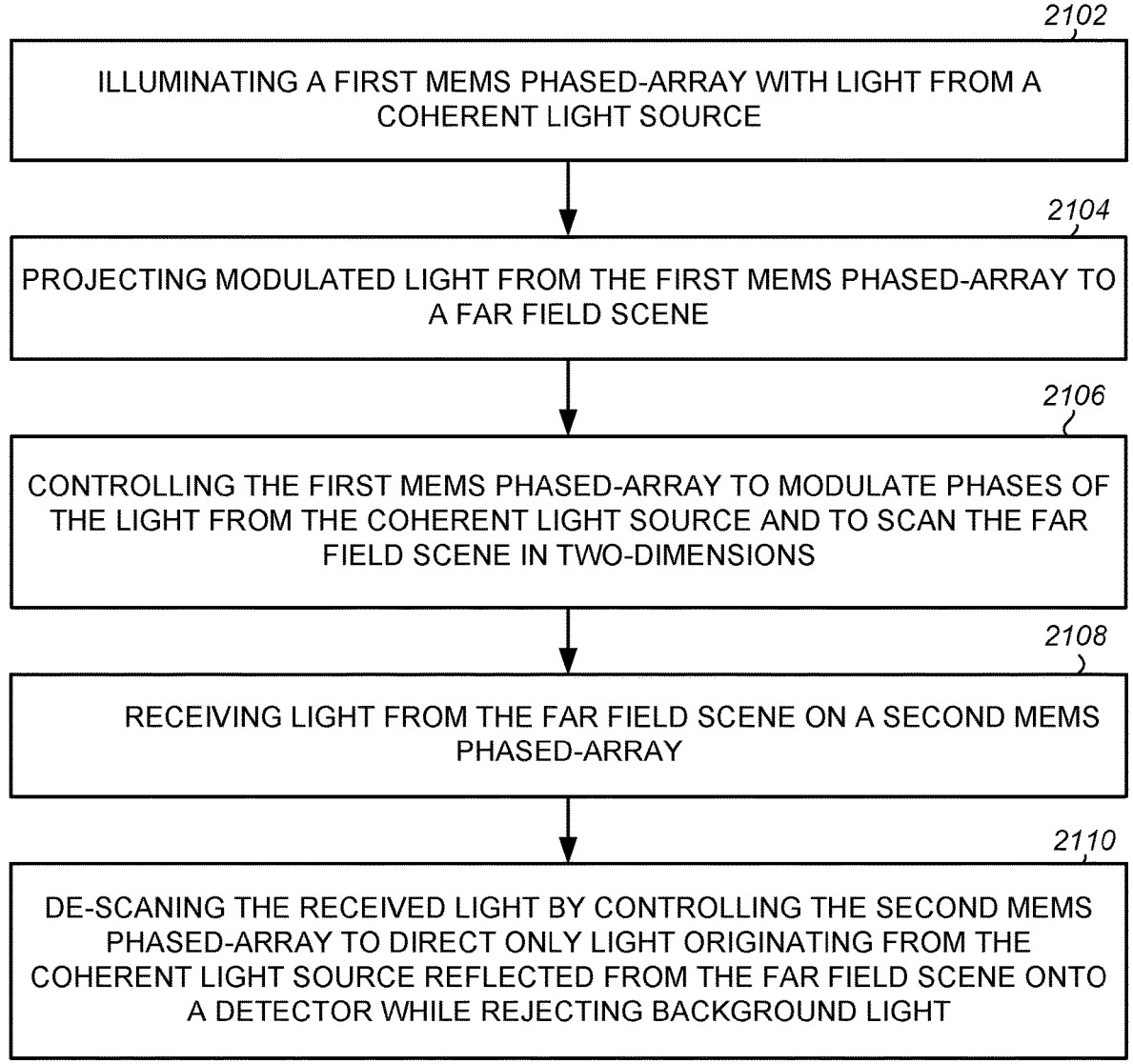
FIG. 21 is a flow chart of a method for operating an optical scanner including a MEMS phased-array for use in a light detection and ranging (LiDAR) system.

A method of operating an optical scanner including a first microelectromechanical system (MEMS) phased-array for use in a light detection and ranging (LiDAR) system will now be described with reference to the flow chart of FIG. 21. Referring to FIG. 21 the method begins with illuminating a first MEMS phased-array with light from a coherent light source (2102). The first MEMS phased-array is controlled to modulate phases of the light from the coherent light source and project the modulated light from the first MEMS phased-array to a far field scene (2104), and the first MEMS phased-array is further operated or controlled to scan the far field scene (2106). As described above, the first MEMS phased-array is adapted or configured to scan the far field scene in two-dimensions (2D), including an angular dimension and an axial dimension parallel to a long axis of the first MEMS phased-array. Next, light from the far field scene is received on a second MEMS phased-array (2108) and the second MEMS phased-array is controlled to de-scan the received light by directing substantially only light originating from the coherent light source and reflected from the far field scene onto a detector while rejecting background light (2110).

In some embodiments, the first MEMS phased-array and the second MEMS phased-array are the same, shared MEMS phased-array, and controlling the first MEMS phased-array includes controlling the shared MEMS phased-array at a first time to modulate phases of the light from the coherent light source to scan the far field scene in 2D, and controlling the second MEMS phased-array includes controlling the shared MEMS phased-array at a second time to de-scan the received light by directing light from the coherent light source reflected from the far field scene onto the detector and rejecting background light.

Thus, embodiments of a LIDAR system including a 1D MEMS phased-array, and methods for operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. An optical scanner comprising:
    an optical transmitter to receive light from a light source and to modulate phases of at least some of the received light to project light onto a far field scene in two-dimensions, the two-dimensions including a first direction over which the light is dispersed to form a swath of illumination and a second dimension over which the swath is steered by modulating phases of the light received from the light source; and
    an optical receiver including a number of first microelectromechanical system (MEMS) phased-arrays to receive light from the far field scene and to direct at least some of the received light onto a detector,
    wherein the number of first MEMS phased-arrays are configured to de-scan the received light by directing light from the light source reflected from the far field scene onto the detector while rejecting background light.

2. The optical scanner of claim 1 the optical transmitter comprises a number of second MEMS phased-arrays to receive light from the light source and to modulate phases of at least some of the received light to project light onto the far field scene in two-dimensions.

3. The optical scanner of claim 2 wherein the optical transmitter further comprises projection optics to project light from the number of second MEMS phased-arrays to the far field scene, and wherein the projection optics comprise a lenticular array to disperse the light in the first direction to form the swath of illumination, and increase a field of view (FOV) of the optical scanner.

4. The optical scanner of claim 3 wherein the light source comprises vertical-cavity surface-emitting laser (VCSEL) array including a plurality of emitters to increase optical power and extend an eye-safe power limit.

5. The optical scanner of claim 4 wherein the optical transmitter further comprises illumination optics to illuminate the number of second MEMS phased-arrays with light from the light source, and wherein at the illumination optics include a lenticular array to individually illuminate one or more light modulators in the number of second MEMS phased-arrays.

6. The optical scanner of claim 5 wherein the optical receiver further comprises receiving optics to receive light from the far field scene and direct received light onto the number of first MEMS phased-arrays, and wherein the receiving optics comprises a lenticular array to increase an effective fill factor of the number of first MEMS phased-arrays.

7. The optical scanner of claim 1 wherein the detector comprises a one dimensional (1D) detector array and the optical receiver is a pointing-receiver in which the first MEMS phased-arrays selectively directs light reflected from a slice of the far field scene onto the 1D detector array while rejecting light reflected from the far field scene outside of the slice and background light.

8. The optical scanner of claim 1 wherein the number of first MEMS phased-arrays comprise a ribbon MEMS phased-array including plurality of ribbons suspended in parallel rows over a substrate, each ribbon having a light reflective surface and a length perpendicular to a long axis of the ribbon MEMS phased-array, and wherein the ribbon MEMS phased-array is configured to deflect at least a number of the plurality of ribbons towards the substrate to modulate phases of light reflected therefrom to scan the far field scene in an angular dimension and an axial dimension parallel to the long axis of the phased-array.

9. The optical scanner of claim 8 wherein the number of first MEMS phased-array comprise multiple ribbon MEMS phased-arrays arranged in line to increase an active aperture of the optical scanner.

10. The optical scanner of claim 9 wherein the ribbon MEMS phased-arrays further include damping structures between the plurality of ribbons and the substrate to modulate phases of light having long wavelengths.

11. The optical scanner of claim 8 wherein each of the plurality of ribbons are divided by posts along a length thereof to form a plurality of ribbon MEMS phased-arrays arranged in parallel to increase an active aperture of the optical scanner.

12. The optical scanner of claim 8 wherein the ribbon MEMS phased-array includes ribbons comprising a blaze profile to shift a $0^{th}$ order of light reflected from the ribbon MEMS phased-array.

13. An optical scanner comprising:
an optical transmitter including a number of microelectromechanical system (MEMS) phased-arrays to receive light from a light source and to project light onto a far field scene in two-dimensions, the two-dimensions including a first direction over which the light is dispersed to form a swath of illumination and a second dimension over which the swath is steered by modulating phases of at least some of the light received from the light source; and
an optical receiver to receive light including at least some light from the optical transmitter reflected from the far field scene and to direct at least some of the received light onto a detector.

14. The optical scanner of claim 13 wherein the optical transmitter further comprises projection optics to project light from the number of MEMS phased-arrays to the far field scene, and wherein the projection optics comprise a lenticular array to disperse the light in the first direction to form the swath of illumination, and increase a field of view (FOV) of the optical scanner.

15. The optical scanner of claim 13 wherein the light source comprises vertical-cavity surface-emitting laser (VCSEL) array including a plurality of emitters to increase optical power and extend an eye-safe power limit.

16. The optical scanner of claim 15 wherein the optical transmitter further comprises illumination optics to illuminate the number of MEMS phased-arrays with light from the light source, and wherein the illumination optics include a lenticular array to individually illuminate one or more light modulators in the number of MEMS phased-arrays.

17. The optical scanner of claim 13 wherein the number of MEMS phased-arrays comprise a ribbon MEMS phased-array including a plurality of ribbons suspended in parallel rows over a substrate, each ribbon having a light reflective surface and a length perpendicular to a long axis of the ribbon MEMS phased-array, and wherein the ribbon MEMS phased-array is configured to deflect at least a number of the plurality of ribbons towards the substrate to modulate phases of light received from the light source to project light onto the far field scene in an angular dimension and an axial dimension parallel to the long axis of the ribbon MEMS phased-array.

18. The optical scanner of claim 17 wherein the number of MEMS phased-arrays comprises multiple ribbon MEMS phased-array arranged in line to increase an active aperture of the optical scanner.

19. The optical scanner of claim 17 wherein the ribbon MEMS phased-array further includes damping structures between the plurality of ribbons and the substrate to modulate phases of light having long wavelengths.

20. The optical scanner of claim 17 wherein each of the plurality of ribbons are divided by posts along a length thereof to form a plurality of ribbon MEMS phased-arrays arranged in parallel to increase an active aperture of the optical scanner.

21. The optical scanner of claim 17 wherein the ribbon MEMS phased-array includes ribbons comprising a blaze profile.

22. A light detection and ranging (LiDAR) system comprising:
a microelectromechanical system (MEMS) phased-array;
a coherent light source;
illumination optics to illuminate the MEMS phased-array with light from the coherent light source;
projection optics to project light from the MEMS phased-array to a far field scene;
receiving optics to receive light from the far field scene and direct received light onto the MEMS phased-array; and
a detector onto which the MEMS phased-array directs at least some of the received light,
wherein the MEMS phased-array is configured to:
at a first time modulate phases of the light from the coherent light source to project light onto the far field scene in two-dimensions (2D), and
at a second time to de-scan the received light by directing light from the coherent light source reflected from the far field scene onto the detector and rejecting background light.

23. The system of claim 22 wherein the MEMS phased-array comprises a ribbon MEMS phased-array including a plurality of ribbons suspended in parallel rows over a substrate, each ribbon having a light reflective surface and a length perpendicular to a long axis of the ribbon MEMS phased-array, and wherein the ribbon MEMS phased-array is configured to deflect at least a number of the plurality of ribbons towards the substrate to modulate phases of light reflected therefrom to project light onto the far field scene in an angular dimension and an axial dimension parallel to the long axis of the ribbon MEMS phased-array.

24. The system of claim 23 wherein the MEMS phased-array comprises multiple ribbon phased-arrays arranged in parallel to increase an active aperture of the system.

25. The system of claim 23 wherein each of the plurality of ribbons are divided by posts along a length thereof to form a plurality of ribbon MEMS phased-arrays arranged in parallel to increase an active aperture of the system.

26. The system of claim 23 wherein the ribbon MEMS phased-array includes ribbons comprising a blaze profile.

27. The system of claim 22 wherein at least one of the illumination optics, projection optics or receiving optics comprises folded anamorphic optics.

* * * * *